United States Patent
Choi et al.

(10) Patent No.: US 11,557,267 B2
(45) Date of Patent: Jan. 17, 2023

(54) DISPLAY DEVICE

(71) Applicant: Samsung Display Co., LTD., Yongin-si (KR)

(72) Inventors: Jun Won Choi, Hwaseong-si (KR); Jae Won Kim, Cheongju-si (KR); Jun Young Min, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/353,235

(22) Filed: Jun. 21, 2021

(65) Prior Publication Data

US 2021/0312886 A1 Oct. 7, 2021

Related U.S. Application Data

(63) Continuation of application No. 16/793,619, filed on Feb. 18, 2020, now Pat. No. 11,043,189.

(30) Foreign Application Priority Data

Feb. 18, 2019 (KR) .......................... 10-2019-0018527

(51) Int. Cl.
  *G09G 5/10* (2006.01)
  *G09G 3/3258* (2016.01)
  *G09G 3/3266* (2016.01)

(52) U.S. Cl.
  CPC ............ *G09G 5/10* (2013.01); *G09G 3/3258* (2013.01); *G09G 3/3266* (2013.01); *G09G 2360/141* (2013.01); *G09G 2360/144* (2013.01)

(58) Field of Classification Search
  CPC ...... G09G 5/10; G09G 3/3258; G09G 3/3266; G09G 2360/141; G09G 2360/144
  USPC .......................................................... 345/204
  See application file for complete search history.

(56) References Cited

U.S. PATENT DOCUMENTS

| | | |
|---|---|---|
| 8,502,752 B2 | 8/2013 | Kasai |
| 10,636,862 B2 | 4/2020 | Tian |
| 10,797,128 B2 | 10/2020 | Tian |

(Continued)

FOREIGN PATENT DOCUMENTS

| | | | |
|---|---|---|---|
| CN | 107194321 | 9/2017 | |
| CN | 107194321 A * | 9/2017 | ........... G06K 9/0004 |

(Continued)

OTHER PUBLICATIONS

Extended European Search Report dated Apr. 28, 2020—European Application No. 20157835.8.

(Continued)

*Primary Examiner* — Mark Edwards
(74) *Attorney, Agent, or Firm* — Cantor Colburn LLP

(57) ABSTRACT

A display device includes a first display area including a plurality of first pixel areas, a second display area including a plurality of second pixel areas and a plurality of transmission areas, a plurality of pixels arranged in a matrix form in the first and second display areas, and a first signal line and a second signal line disposed to correspond to each pixel column in the plurality of pixels. In each pixel column, one of the first and second signal lines may extend over the first and second display areas, and a remaining one of the first and second signal lines may not be disposed in the second display area.

20 Claims, 16 Drawing Sheets

(56) References Cited

U.S. PATENT DOCUMENTS

| | | | | |
|---|---|---|---|---|
| 2010/0066655 | A1* | 3/2010 | Uh | G02F 1/136286 |
| | | | | 345/87 |
| 2014/0139458 | A1* | 5/2014 | Premutico | G09G 3/3208 |
| | | | | 345/82 |
| 2016/0321977 | A1 | 11/2016 | Kong et al. | |
| 2017/0330503 | A1 | 11/2017 | Yang et al. | |
| 2017/0371213 | A1* | 12/2017 | Wang | G02F 1/136277 |
| 2018/0330679 | A1* | 11/2018 | Hao | G09G 3/3607 |
| 2020/0019747 | A1* | 1/2020 | Yang | H01L 27/3276 |
| 2020/0058726 | A1 | 2/2020 | Ma et al. | |

FOREIGN PATENT DOCUMENTS

| | | | | |
|---|---|---|---|---|
| CN | 108470751 | | 8/2018 | |
| CN | 109037298 | | 12/2018 | |
| JP | 5336581 | | 8/2013 | |
| KR | 20170024182 A | * | 3/2017 | H01L 27/326 |
| KR | 1020170024182 | | 3/2017 | |
| KR | 1020170031323 | | 3/2017 | |
| KR | 101859105 | | 5/2018 | |
| KR | 1020180050473 | | 5/2018 | |

OTHER PUBLICATIONS

European Search Report—European Patent Application No. 20157835.8 dated Nov. 26, 2021.

\* cited by examiner

DISPLAY DEVICE

This application is a continuation of U.S. patent application Ser. No. 16/793,619, filed on Feb. 18, 2020, which claims priority to Korean Patent Application No. 10-2019-0018527 filed on Feb. 18, 2019, and all the benefits accruing therefrom under 35 U.S.C. § 119, the content of which in its entirety is herein incorporated by reference.

BACKGROUND

(a) Field

Exemplary embodiments of the invention relate to a display device.

(b) Description of the Related Art

A display device includes a display panel including pixels that display an image. The display device may include a sensor that senses proximity of an object, ambient brightness, etc., and the sensor may be disposed in a periphery of the display panel. The sensor is disposed in a bezel area (an area surrounding a screen) of the display device, an optical member is included in the bezel area (or an edge area), and the object may be recognized by the sensor.

When the sensor is an optical sensor such as an infrared sensor, for example, the sensor may transmit light and receive light reflected by the object. The display device may calculate a distance between the display device and the object based on intensity of the reflected light, and may not display an image when the distance is within a predetermined distance. When the sensor is an illuminance sensor, the sensor may measure illuminance around the display device, and the display device may adjust brightness of the screen based on the measured illuminance.

By reducing a size of bezel of the display device, it is possible to increase a screen-to-body ratio of the display device, that is, a ratio of the screen to the display device when viewed from the front thereof. The screen-to-body ratio represents a technical level of the display device, and at the same time, it is important for a consumer to select a product.

SUMMARY

Since it is difficult to dispose the sensor in the bezel area as the size of bezel of the display device is reduced, it is desired to develop techniques for disposing the sensor and for sensing.

Exemplary embodiments provide a display device that may improve transmittance and display quality of a display area corresponding to an optical member in the display device including the optical member.

An exemplary embodiment provides a display device including a first display area including a plurality of first pixel areas, a second display area including a plurality of second pixel areas and a plurality of transmission areas, a plurality of pixels arranged in a matrix form in the first and second display areas, and a first signal line and a second signal line disposed to correspond to each of pixel columns in the plurality of pixels. In each of the pixel columns, one of the first and second signal lines may extend over the first and second display areas and a remaining one of the first and second signal lines may not be disposed in the second display area.

In an exemplary embodiment, the first and second signal lines may be disposed in the first display area in each of the pixel columns.

In an exemplary embodiment, the plurality of second pixel areas and the plurality of transmission areas may be arranged in a checkerboard pattern in the second display area.

In an exemplary embodiment, the first and second signal lines may be data lines transmitting a data signal.

In an exemplary embodiment, each of the second pixel areas may include at least one pixel electrode, and the plurality of transmission areas may not include a pixel electrode.

In an exemplary embodiment, the second display area may include a plurality of scan lines, and a voltage line disposed in a same layer as the at least one pixel electrode. The voltage line may include a portion that overlaps at least one of the plurality of scan lines and extends side by side therewith in at least one of the plurality of transmission areas.

In an exemplary embodiment, pixels of each of the pixel columns among the plurality of pixels may be alternately connected to the first and second signal lines one by one.

In an exemplary embodiment, sizes of the second pixel areas and sizes of the transmission areas may be the same.

In an exemplary embodiment, a size of at least one of the plurality of transmission areas may be larger than that of each of the second pixel areas.

In an exemplary embodiment, each of the second pixel areas may include at least one of a red pixel, a green pixel, and a blue pixel.

In an exemplary embodiment, each of the second pixel areas may include one red pixel, one blue pixel, and two green pixels.

In an exemplary embodiment, the second display area may display a single color.

In an exemplary embodiment, the display device may further include an optical member overlapping the second display area.

An exemplary embodiment provides a display device including a first display area including a plurality of first pixel areas, a second display area including a plurality of second pixel areas and a plurality of transmission areas, a plurality of pixels arranged in a matrix form in the first and second display areas, a plurality of scan lines extending in a first direction in the first and second display areas; and a first signal line and a second signal line extending in a second direction crossing the first direction in the plurality of pixels and overlapping each other in each of pixel columns. In each of the pixel columns, both the first and second signal lines may be disposed in the first display area, and only one of the first and second signal lines may be disposed in the second display area.

In an exemplary embodiment, the first and second signal lines may be data lines transmitting a data signal, and pixels of each of the pixel columns among the plurality of pixels may be alternately connected to the first and second signal lines one by one.

In the exemplary embodiments, it is possible to improve sensing sensitivity of an optical member and display quality by improving transmittance of a display area corresponding to the optical member in the display device including the optical member.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
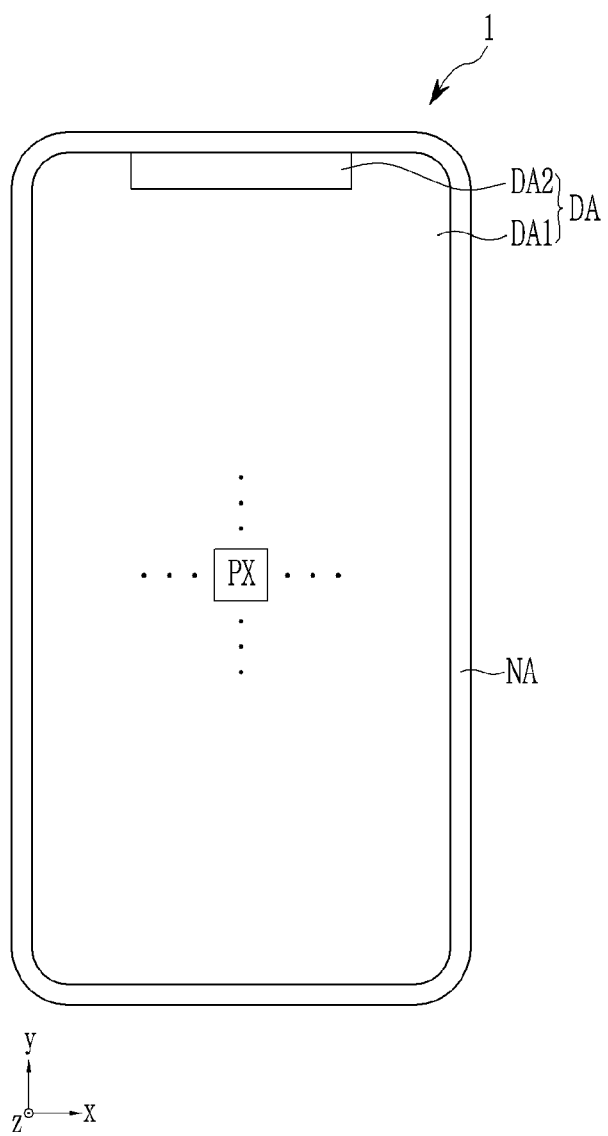
FIG. 1 illustrates a schematic top plan view of an exemplary embodiment of a display device.

The invention will be described more fully hereinafter with reference to the accompanying drawings, in which embodiments of the invention are shown. As those skilled in the art would realize, the described embodiments may be modified in various different ways, all without departing from the spirit or scope of the invention.

Parts that are irrelevant to the description will be omitted to clearly describe the invention, and like reference numerals designate like elements throughout the specification.

Further, in the drawings, the size and thickness of each element are arbitrarily illustrated for ease of description, but the invention is not limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the specification, unless explicitly described to the contrary, the word "comprise" and variations such as "comprises" or "comprising" will be understood to imply the inclusion of stated elements but not the exclusion of any other elements.

In the drawings, as symbols used for indicating directions, "x" is a first direction, "y" is a second direction perpendicular to the first direction, and "z" is a third direction perpendicular to the first direction and the second direction. The first direction x, the second direction y, and the third direction z may correspond to a horizontal direction, a vertical direction, and a thickness direction of the display device, respectively.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, a display device (a light emitting display device as an example) according to embodiments will be described with reference to the drawings.

First, an exemplary embodiment of a display device will be described with reference to FIGS. 1 and 2. FIG. 1 illustrates a schematic top plan view of an exemplary embodiment of a display device 1, and FIG. 2 illustrates a schematic cross-sectional view of an exemplary embodiment of the display device 1.

Figure 2:
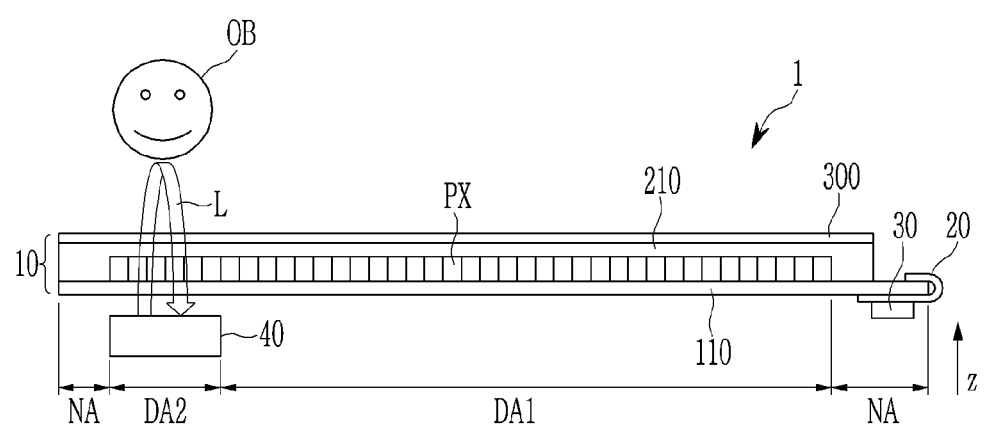
FIG. 2 illustrates a schematic cross-sectional view of an exemplary embodiment of a display device.

Referring to FIGS. 1 and 2, the display device 1 may include a display panel 10, a flexible printed circuit film 20 connected to the display panel 10, a driving device including an integrated circuit ("IC") chip 30, and an optical member 40.

The display panel 10 may include a display area DA for displaying an image and a non-display area NA surrounding the display area DA. The display area DA may correspond to a screen, and the non-display area NA may correspond to a bezel. Pixels PX are arranged in a matrix form in the display area DA. Circuits and/or signal lines for generating and/or transmitting various signals to be applied to the display area DA are disposed in the non-display area NA. A scan line, an emission control line, a data line, a driving voltage line, and the like are connected to each pixel PX, and the pixel PX may receive a scan signal, an emission control signal, a data signal, a driving voltage, and the like from these lines.

The display area DA includes a first display area DA1 and a second display area DA2. The second display area DA2 has higher transmittance than that of the first display area DA1 so as to be able to perform another function in addition to a unique function of displaying an image. To this end, a density of the pixels PX may be lower in the second display area DA2 than in the first display area DA1. Here, the transmittance means transmittance of light through the display panel 10 in the third direction z. The light may be light having a wavelength other than the wavelength of visible light, for example, infrared light, but may also include visible light.

A ratio of an area where an image may be displayed in the second display area DA2, that is, an area occupied by a pixel area, may be smaller than that of an area occupied by the pixel area in the first display area DA1. In an exemplary embodiment, the second display area DA2 includes the pixel area and a transmission area, and the transmission area has higher transmittance than that of the pixel area, for example. The pixel PX may not be disposed in the transmission area. Here, the pixel PX is a minimum unit for forming a screen, that is, a minimum unit for displaying an image, and each pixel PX may display a specific color, for example, any one of red, green, and blue colors at various luminance levels, according to an input image signal.

The second display area DA2 may be disposed above the first display area DA1. Both sides of the second display area DA2 may be the first display area DA1 as shown, but the second display area DA2 may be variously positioned. In an exemplary embodiment, the second display area DA2 may completely cross an upper end of the display area DA to be disposed along the first direction x, for example. The second display area DA2 may be surrounded by the first display area DA1. The second display area DA2 may be disposed at a left or right side of the upper end of the display area DA, and may not be disposed at a central portion of the upper end of the display area DA but may be separately disposed at the left and right sides. The second display area DA2 may be substantially rectangular. In an exemplary embodiment, the second display area DA2 may have various shapes such as a trapezoid, a circle, and an ellipse.

A driving unit for generating and/or processing various signals for driving the display panel 10 may be disposed in the non-display area NA of the display panel 10. The driving unit includes a data driver for applying a data signal to data lines, a scan driver for applying a scan signal to scan lines, an emission driver for applying an emission control signal to emission control lines, and a signal controller for controlling the data driver, the scan driver, and the emission driver. The scan driver and the emission driver may be integrated in the display panel 10, and may be disposed at the left and right sides of the display area DA or at one side thereof. The data driver and the signal controller may be provided as an IC chip (also referred to as a driving IC chip) 30, and the IC chip 30 may be disposed (e.g., mounted) on the flexible printed circuit film 20 to be electrically connected to the display panel 10. The IC chip 30 may be disposed (e.g., mounted) on the non-display area NA of the display panel 10.

The display panel 10 may include a substrate 110, and the pixels PX may be disposed on the substrate 110. The substrate 110 may be continuously disposed over the first display area DA1 and the second display area DA2. The display panel 10 may include an encapsulation layer 210 entirely covering the pixels PX. The encapsulation layer 210 may seal the first display area DA1 and the second display area DA2 to prevent water or oxygen from penetrating into the display panel 10. When the encapsulation layer 210 is in a form of a substrate, the substrate 110 and the encapsulation layer 210 may be bonded together by a sealant. An anti-reflection layer 300 for reducing external light reflection may be disposed on the encapsulation layer 210, and the anti-reflection layer 300 may include a polarization layer and/or a retardation layer.

The optical member 40 may be disposed on a back surface of the display panel 10. In an exemplary embodiment, the optical member 40 may be a sensor, a camera, a flash, or the like. When the optical member 40 is a sensor, the optical member 40 may be a proximity sensor or an illuminance sensor. Light of a wavelength used by the optical member 40 may pass through the display panel 10 at higher transmittance through the second display area DA2. Various electronic devices may be disposed on the back surface of the display panel 10 in addition to the optical member 40.

The optical member 40 may emit light L in a predetermined wavelength range toward an object OB disposed on a front surface of the display panel 10 or receive light L reflected from the object OB. The light L having the predetermined wavelength may be light having a wavelength that may be processed by the optical member 40, and may be light having a wavelength other than the wavelength in a visible light region, which corresponds to a region of light of an image displayed by the pixel PX. The light L of the predetermined wavelength may mainly pass through a transmission area disposed in the second display area DA2. In an exemplary embodiment, when the optical member 40 uses infrared light, the light of the predetermined wavelength may have a wavelength range of about 900 nanometers (nm) to about 1000 nm, for example. The optical member 40 may receive light of a predetermined wavelength to be irradiated onto the front surface of the display panel 10. The light of the predetermined wavelength may include visible light. The optical member 40 may be disposed corresponding to all of the second display area DA2, or may be disposed corresponding to only some of the second display area DA2. A plurality of optical members 40 may be disposed in the second display area DA2.

The first display area DA1 and the second display area DA2 of the display device 1 in the exemplary embodiment will now be described with reference to FIGS. 3 to 5 together with the above-described drawings.

Figure 3:
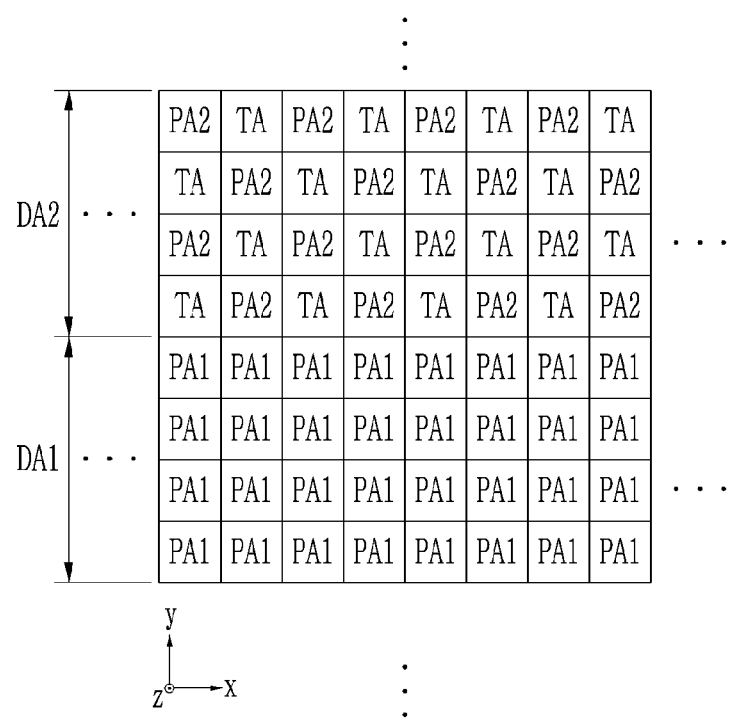
FIGS. 3, 4, and 5 illustrate schematic plan views of an exemplary embodiment of a first display area and a second display area of a display device.
Figure 4:
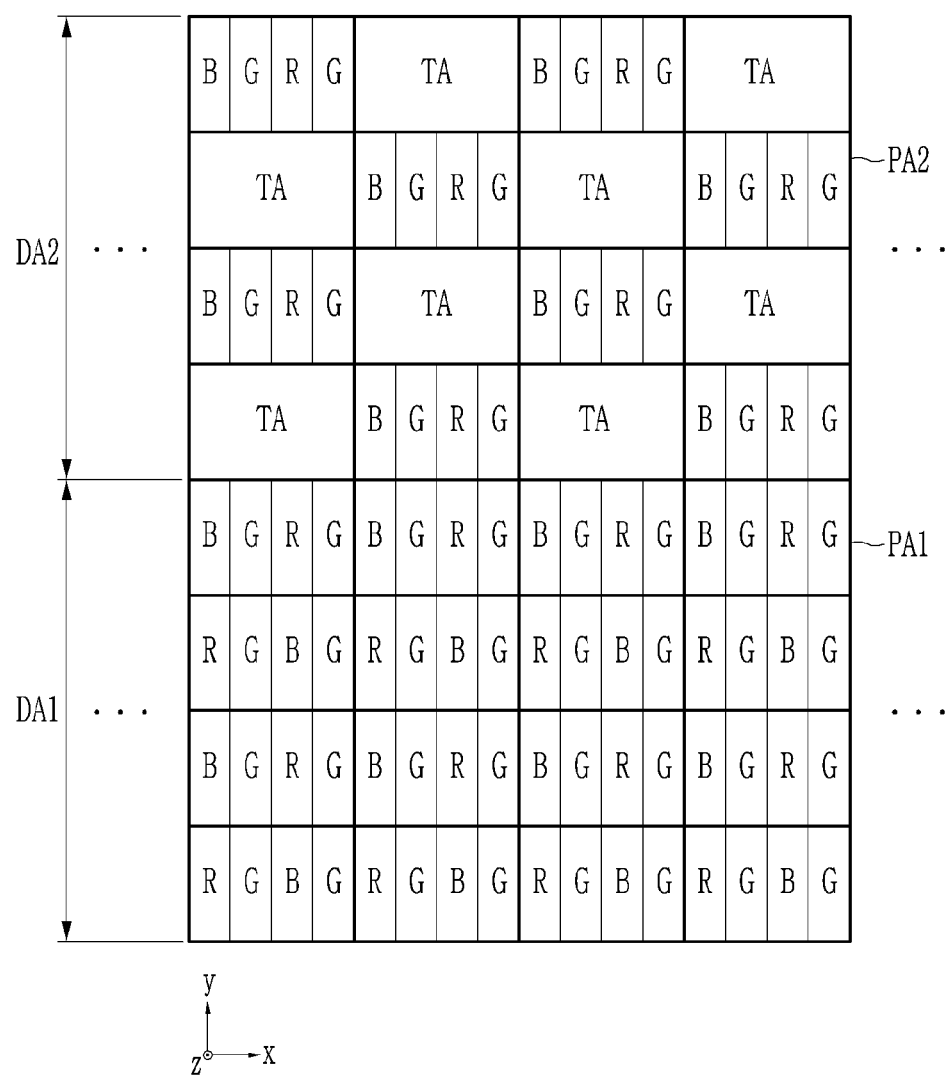
Figure 5:
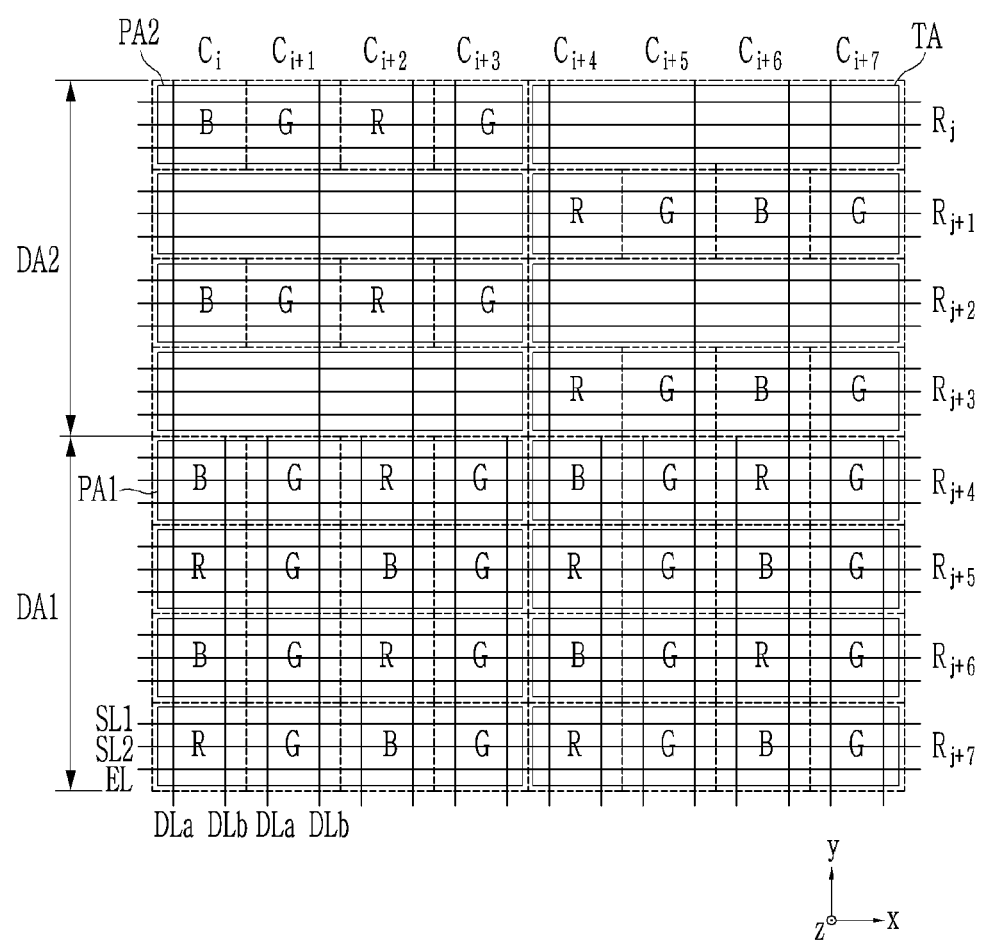

FIGS. 3, 4, and 5 illustrate schematic plan views of an exemplary embodiment of the first display area DA1 and the second display area DA2 of the display device. FIG. 3 illustrates a schematic plan view of pixel areas PA1 and PA2 and the transmission area TA, FIG. 4 specifically illustrates a pixel that may be included in the pixel areas PA1 and PA2, and FIG. 5 illustrates some signal lines disposed in the pixel areas PA1 and PA2.

Referring to FIG. 3, the first display area DA1 includes the first pixel areas PA1, and the second display area DA2 includes the second pixel areas PA2 and the transmission areas TA. A size of one first pixel area PA1 and a size of one second pixel area PA2 may be the same or different.

In the first display area DA1, the first pixel areas PA1 may be arranged in a matrix form in the first direction x and the second direction y which are different directions. In the second display area DA2, the second pixel areas PA2 and the transmission areas TA may be arranged in a matrix form. The second pixel areas PA2 and the transmission areas TA may be arranged in a checkerboard pattern so that the second pixel areas PA2 and the transmission areas TA may be uniformly mixed. That is, the transmission areas TA are adjacent to one second pixel area PA2 in the first direction x and the second direction y, and the second pixel area PA2 may be adjacent to one transmission area TA in the first direction x and the second direction y. A size of one second pixel area PA2 and a size of one transmission area TA may be the same or different. Respective transmission areas TA may have the same size or may be different from each other in size. An arrangement and size of the second pixel areas PA2 and the transmission areas TA may be variously changed.

Each of the pixel areas PA1 and PA2 may include one or more pixels PX. In the exemplary embodiment shown in FIGS. 4 and 5, each of the pixel areas PA1 and PA2 may include one red pixel R, two green pixels G, and one blue pixel B. Respective transmission areas TA may have sizes corresponding to the four pixels.

The pixels R, G, and B included in the pixel areas PA1 and PA2 form pixel rows $R_j$, $R_{j+1}$, $R_{j+2}$, . . . , $R_{j+7}$ in the first direction x where j is a natural number. Although FIGS. 4 and 5 each show eight pixel rows, the display area DA may include a number of pixel rows corresponding to a predetermined resolution. In each pixel row, the pixels R, G, and B are substantially arranged in a line in a direction parallel to the first direction x. The pixels R, G, and B in each pixel row are repeatedly arranged in an order of the blue pixel B, the green pixel G, the red pixel R, and the green pixel G in the first direction x, or in an order of the red pixel R, the green pixel G, the blue pixel B, and the green pixel G. In each pixel row of the second display area DA2, the transmission area TA may be disposed between adjacent second pixel areas PA2. The arrangement of the pixels R, G, and B included in one pixel row may be variously changed. In an exemplary embodiment, the pixels R, G, and B may be repeatedly arranged in an order of the red pixel R, the blue pixel B, the green pixel G, and the blue pixel B in the first direction x, for example.

The pixels R, G, and B included in the pixel areas PA1 and PA2 also form pixel columns $C_i, C_{i+1}, C_{i+2}, \ldots, C_{i+7}$ in the second direction y where i is a natural number. Although FIG. 4 shows 16 pixel columns and FIG. 5 shows 8 pixel columns, the display area DA may include a number of pixel columns corresponding to a predetermined resolution. In each pixel column, the pixels R, G, and B are substantially arranged in a line in a direction parallel to the second direction y. In an exemplary embodiment, the pixel column $C_i$ shown at a leftmost side in FIG. 5 includes the blue pixel B, the blue pixel B, the blue pixel B, the red pixel R, the blue pixel B, and the red pixel R, for example. Due to the transmission area TA in the second display area DA2, the pixel column $C_i$ may not include the red pixel R in the second display area DA2. In other words, no pixels are disposed at a position where the red pixel R is to be disposed in the second display area DA2. The pixel column $C_{i+1}$ adjacent to the pixel column $C_i$ includes only the green pixels G. A pixel column $C_{i+2}$ includes the red pixel R, the red pixel R, the red pixel R, the blue pixel B, the red pixel R, and the blue pixel B. Due to the transmission area TA in the second display area DA2, the pixel column $C_{i+2}$ may not include the blue pixel B in the second display area DA2. A pixel column $C_{i+3}$ includes only the green pixels G. Such a pixel arrangement may be repeated in the first direction x with four pixel columns $C_i, C_{i+1}, C_{i+2},$ and $C_{i+3}$ as a basic unit. The arrangement of the pixels R, G, and B included in one pixel column may be variously changed.

Scan lines SL1 and SL2 and an emission control line EL may extend in the first direction x along respective pixel rows $R_j, R_{j+1}, R_{j+2}, \ldots, R_{j+7}$, and data lines DLa and DLb may extend in the second direction y along respective pixel columns $C_i, C_{i+1}, C_{i+2}, \ldots, C_{i+7}$.

The data lines DLa and DLb, which are signal lines for transmitting a data signal, may include a first data line DLa and a second data line DLb which are paired with each other. In each pixel column, one of the pair of data lines DLa and DLb may be connected to the pixels disposed on an odd-numbered pixel row, and the other may be connected to the pixels disposed on an even-numbered pixel row. In an exemplary embodiment, in the pair of data lines DLa and DLb, the first data line DLa may be connected to the pixels disposed on the odd-numbered pixel row, and the second data line DLb may be connected to the pixels disposed on the even-numbered pixel row, for example. In contrast, in the pair of data lines DLa and DLb, the first data line DLa may be connected to the pixels disposed on the even-numbered pixel row, and the second data line DLb may be connected to the pixels disposed on the odd-numbered pixel row.

The data lines DLa and DLb in each pixel column are disposed in both the first display area DA1 and the second display area DA2, but one of the data lines DLa and DLb is substantially disposed only in the first display area DA1 and is not disposed in the second display area DA2. In an exemplary embodiment, the second data line DLb is not disposed in the second display area DA2 in the pixel column $C_i$, and the first data line DLa is not disposed in the second display area DA2 in the pixel column $C_{i+1}$, for example. As such, even though only one of the pair of data line DLa and DLb extends to the second display area DA2, since the pixel is disposed only in even-numbered or odd-numbered rows for each pixel column in the second display area DA2, the pixels disposed in the second display area DA2 may receive a data signal through the data line extending to the second display area DA2. In addition, since only one data line is disposed in the transmission area TA of the second display area DA2 in each pixel column, it is possible to increase transmittance of each transmission area TA and transmittance of the second display area DA2.

Figure 6:
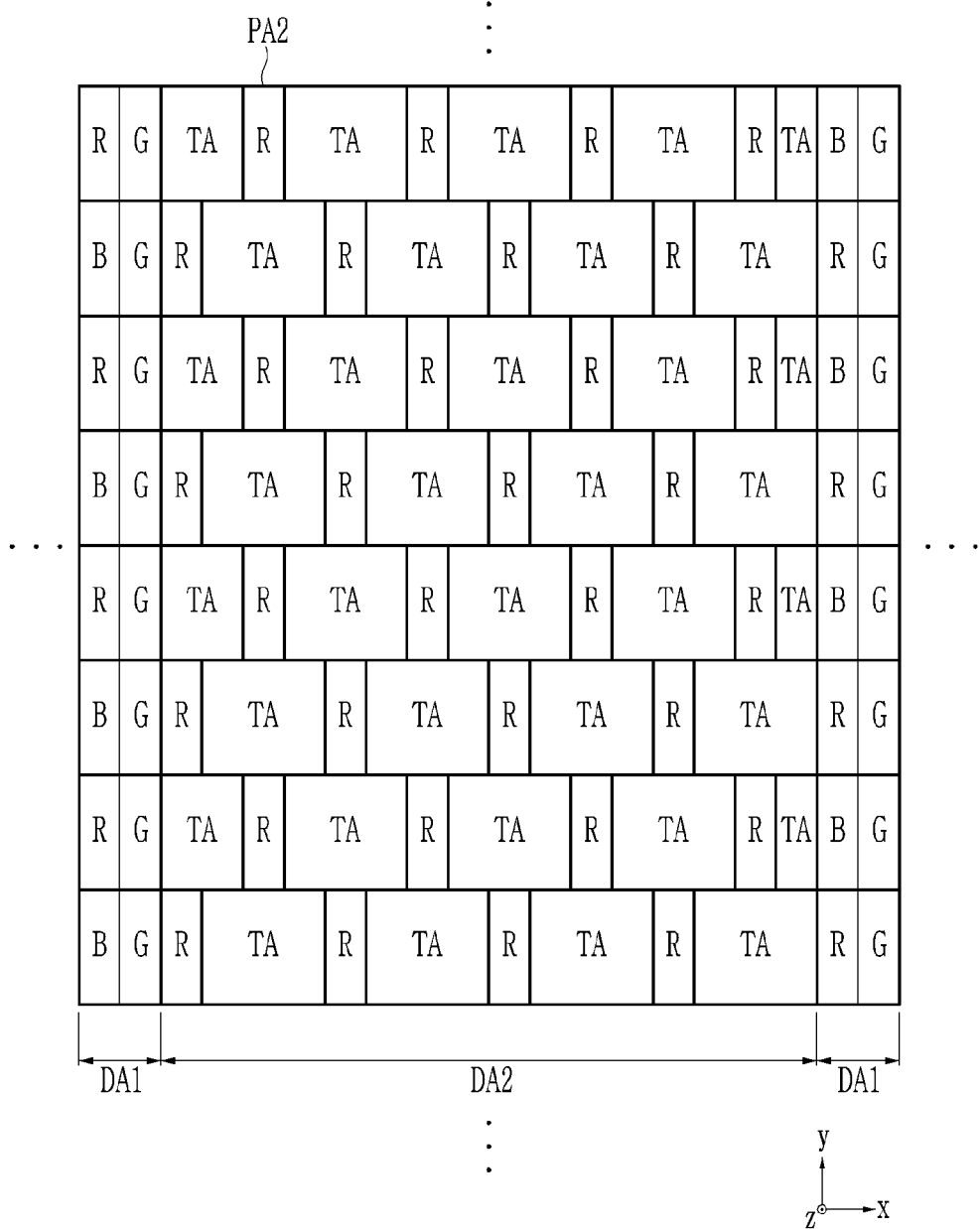
FIG. 6 illustrates a plan view of an exemplary embodiment of a second display area of a display device.

FIG. 6 illustrates a plan view of an exemplary embodiment of a second display area DA2 of a display device.

FIG. 6 illustrates an example in which the first display areas DA1 are disposed at opposite sides of the second display area DA2 and the transmission areas TA are not the same but are changed. Each second pixel area PA2 may include one pixel. In the shown embodiment, although each second pixel area PA2 includes the red pixel R, it may include the blue pixel B or the green pixel G, and it may display a single color (e.g., a red, blue, or green color). Each second pixel area PA2 may include two or more of the red pixel R, the green pixel G, and the blue pixel B.

A pixel (e.g., the red pixel R) may be disposed only in the even-numbered pixel row or the odd-numbered pixel row in each pixel column. A pixel is not disposed in a pixel column (e.g., the fourth pixel column from the left side, the third pixel column from the right side), and only the transmission area TA may be disposed therein. The transmission area TA may have a size corresponding to one pixel, a size corresponding to two pixels, or a size corresponding to three pixels. In the shown embodiment, the transmission areas TA having the size corresponding to three pixels occupy the majority of the area thereof. The transmission area TA may have a size corresponding to three or more pixels.

As such, by reducing the number of the pixels included in each second pixel area PA2, a ratio of the transmission areas TA may be increased in the second display area DA2, thereby increasing the transmittance of the second display area DA2. However, a density of the pixels is lowered, thus a resolution of the second display area DA2 may be decreased. Only one of the data lines DLa and DLb described above may extend in each pixel column in the second display area DA2 to be connected to the pixels disposed in the odd-numbered pixel row or the even-numbered pixel row. Thus, a data voltage may be applied to the pixels disposed in the second display area DA2, and it is possible to increase the transmittance of the transmission area TA. Both of the data lines DLa and DLb may not extend in the pixel column that does not include a pixel in the second display area DA2, and it is possible to further increase the transmittance of the second display area DA2.

Figure 7:
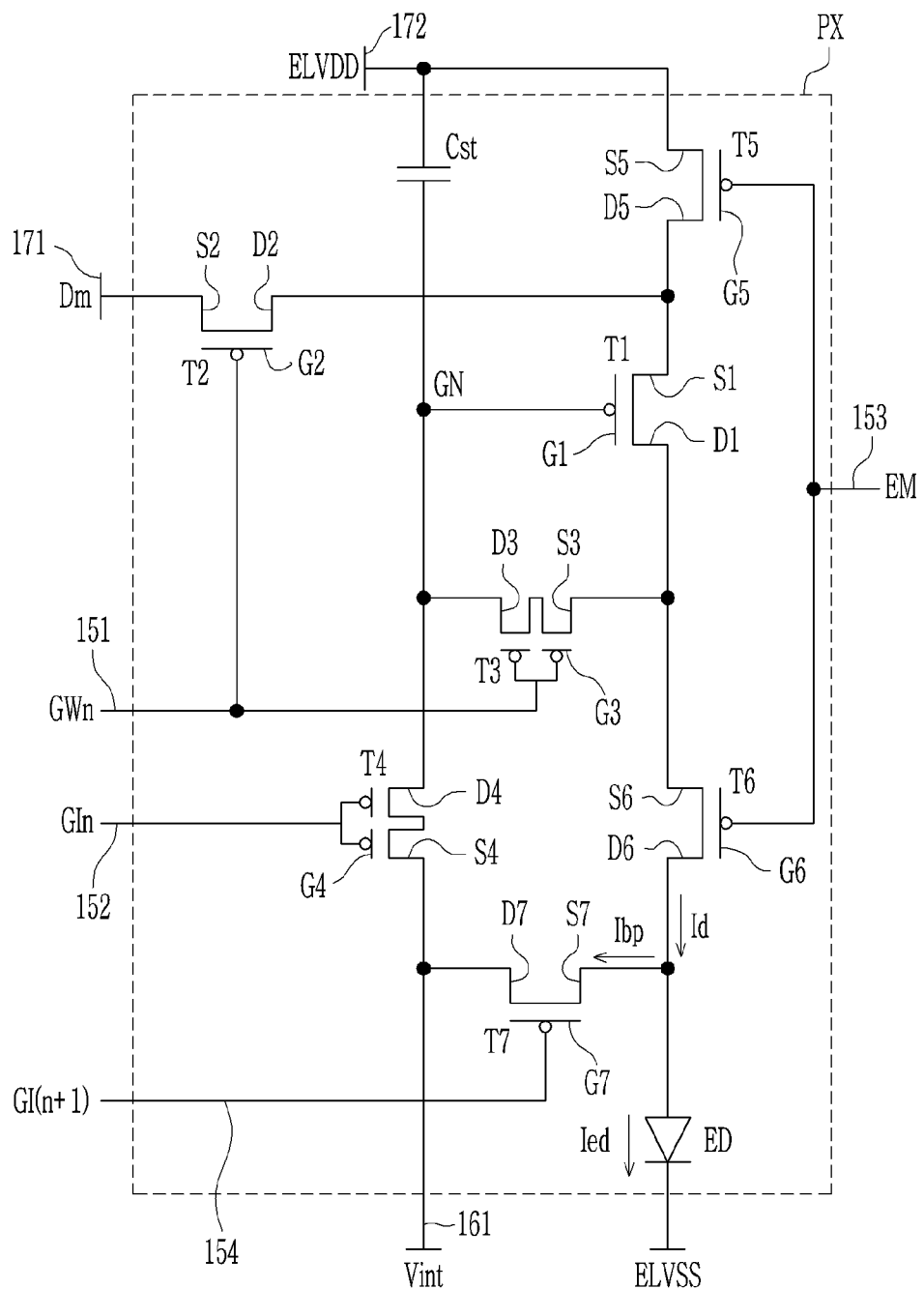
FIG. 7 illustrates a circuit diagram of one pixel of a display device.

FIG. 7 illustrates a circuit diagram of an exemplary embodiment of one pixel of a display device.

Referring to FIG. 7, one pixel PX includes transistors T1, T2, T3, T4, T5, T6, and T7, a capacitor Cst, and a light emitting diode ED that are connected to signal lines 151, 152, 153, 154, 161, 171, and 172.

The signal lines 151, 152, 153, 154, 161, 171, and 172 may include scan lines 151, 152, and 154, an emission control line 153, a data line 171, a driving voltage line 172, and an initialization voltage line 161.

The scan lines 151, 152, and 154 may transmit scan signals GWn, GIn, and GI(n+1), respectively. The scan signals GWn, GIn, and GI(n+1) may transmit a gate-on voltage and a gate-off voltage that may turn on and turn off the transistors T2, T3, T4, and T7 included in the pixel PX.

The scan lines 151, 152, and 154 connected to one pixel PX may include a first scan line 151 capable of transmitting the scan signal GWn, a second scan line 152 capable of transmitting the scan signal GIn having a gate-on voltage at different timing from that of the first scan line 151, and a third scan line 154 capable of transmitting the scan signal GI(n+1). The second scan line 152 may transmit the gate-on voltage at earlier timing than the first scan line 151. In an exemplary embodiment, when the scan signal GWn is an n-th scan signal among the scan signals applied during one frame, the scan signal GIn may be a previous scan signal such as an (n−1)-th scan signal and the like, and the scan signal GI(n+1) may be the n-th scan signal, for example. In another exemplary embodiment, the scan signal GI(n+1) may be a different scan signal from the n-th scan signal.

The emission control line 153 may transmit an emission control signal EM to be able to control light emission of the light emitting diode ED. The emission control signal EM may include a gate-on voltage and a gate-off voltage.

The data line 171, which is one of the data lines DLa and DLb described above, may transmit a data signal Dm. The driving voltage line 172 may transmit a driving voltage ELVDD. The data signal Dm may have a different voltage level depending on an image signal inputted to the display device, and the driving voltage ELVDD may have a substantially constant level. The initialization voltage line 161 may transmit a constant voltage such as an initialization voltage Vint.

The display device may include a driving device (e.g., a scan driver, an emission driver, a data driver, a signal controller, etc.) for generating signals transmitted to the signal lines 151, 152, 153, 154, 161, 171, and 172.

The transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3. The second scan line 152 may transmit the scan signal GIn to the fourth transistor T4. The third scan line 154 may transmit the scan signal GI(n+1) to the seventh transistor T7. The emission control line 153 may transmit the emission control signal EM to the fifth transistor T5 and the sixth transistor T6. Respective transistors T1, T2, T3, T4, T5, T6, and T7 may include respective source electrodes S1, S2, S3, S4, S5, S6, and S7, respective drain electrodes D1, D2, D3, D4, D5, D6, and D7, and respective gate electrodes G1, G2, G3, G4, G5, G6, and G7, and may be connected as shown.

The first transistor T1 may receive the data signal Dm transmitted from the data line 171 according to a switching operation of the second transistor T2, and may supply a driving current Id to the light emitting diode ED.

The second transistor T2 may be turned on depending on the scan signal GWn transmitted through the first scan line 151 to transmit the data signal Dm transmitted from the data line 171 to the source electrode S1 of the first transistor T1.

The third transistor T3 may be turned on depending on the scan signal GWn transmitted through the first scan line 151 to connect the gate electrode G1 and the drain electrode D1 of the first transistor T1 to each other to diode-connect the first transistor T1.

The fourth transistor T4 is turned on depending on the scan signal GIn transmitted through the second scan line 152 to transmit the initialization voltage Vint to the gate electrode G1 of the first transistor T1, thereby performing an initialization operation of initializing the voltage of the gate electrode G1 of the first transistor T1.

The fifth transistor T5 and the sixth transistor T6 are simultaneously turned on depending on the emission control signal EM transmitted through the emission control line 153, thereby the driving voltage ELVDD is compensated through the diode-connected first transistor T1 to be transmitted to the light emitting diode ED.

The transistors T1, T2, T3, T4, T5, T6, and T7 may be P-type channel transistors such as a P-type metal-oxide semiconductor ("PMOS"), and at least one of the transistors T1, T2, T3, T4, T5, T6, and T7 may be an N-type channel transistor.

One end of the capacitor Cst may be connected to the gate electrode G1 of the first transistor T1, and the other end thereof may be connected to the driving voltage line 172. A cathode of the light emitting diode ED may be connected to a common voltage (ELVSS) terminal for transmitting a common voltage ELVSS to receive the common voltage ELVSS.

The number of transistors and the number of capacitors that are included in one pixel PX and a connection relationship thereof may be variously modified.

An operation of the display device in the exemplary embodiment will be briefly described as follows. When the scan signal GIn of the gate-on voltage level is supplied through the second scan line 152 during an initialization period (the scan signal GIn may be an (n−1)-th scan signal), the fourth transistor T4 is turned on, the initialization voltage Vint is transmitted to the gate electrode G1 of the first transistor T1 through the fourth transistor T4, and the first transistor T1 is initialized by the initialization voltage Vint.

Subsequently, when the scan signal GWn of the gate-on voltage level is supplied through the first scan line 151 during a data programming and compensation period (the scan signal GWn may be an n-th scan signal), the second transistor T2 and the third transistor T3 are turned on. The first transistor T1 is diode-connected by the turned-on third transistor T3 and is biased in a forward direction. Accordingly, a compensation voltage that is decreased by a threshold voltage Vth of the first transistor T1 from the data signal Dm supplied from the data line 171 is applied to the gate electrode G1 of the first transistor T1. The driving voltage ELVDD and the compensation voltage are respectively applied to opposite terminals of the capacitor Cst, and the capacitor Cst is charged with a charge corresponding to a voltage difference of the opposite terminals.

Next, when the emission control signal EM supplied from the emission control line 153 is changed from the gate-off voltage level to the gate-on voltage level during the light emission period, the fifth transistor T5 and the sixth transistor T6 are turned on, the driving current Id corresponding to a voltage difference between a gate voltage of the gate electrode G1 of the first transistor T1 and the driving voltage ELVDD is generated, and the driving current Id is supplied to the light emitting diode ED through the sixth transistor T6, thus a current Ied flows through the light emitting diode ED.

During an initialization period, the seventh transistor T7 receives the scan signal GI(n+1) of the gate-on voltage level through the third scan line 154 to be turned on. The scan signal GI(n+1) may be the n-th scan signal. Some of the driving current Id flows out through the turned-on seventh transistor T7 as a bypass current Ibp.

Hereinafter, a detailed structure of the display device in the exemplary embodiment will be described with reference to FIGS. 8 to 12. For better understanding and ease of description, layers will be described in a stacked order in a cross-sectional view, and a planar structure thereof will be described in a description of each layer.

Figure 8:
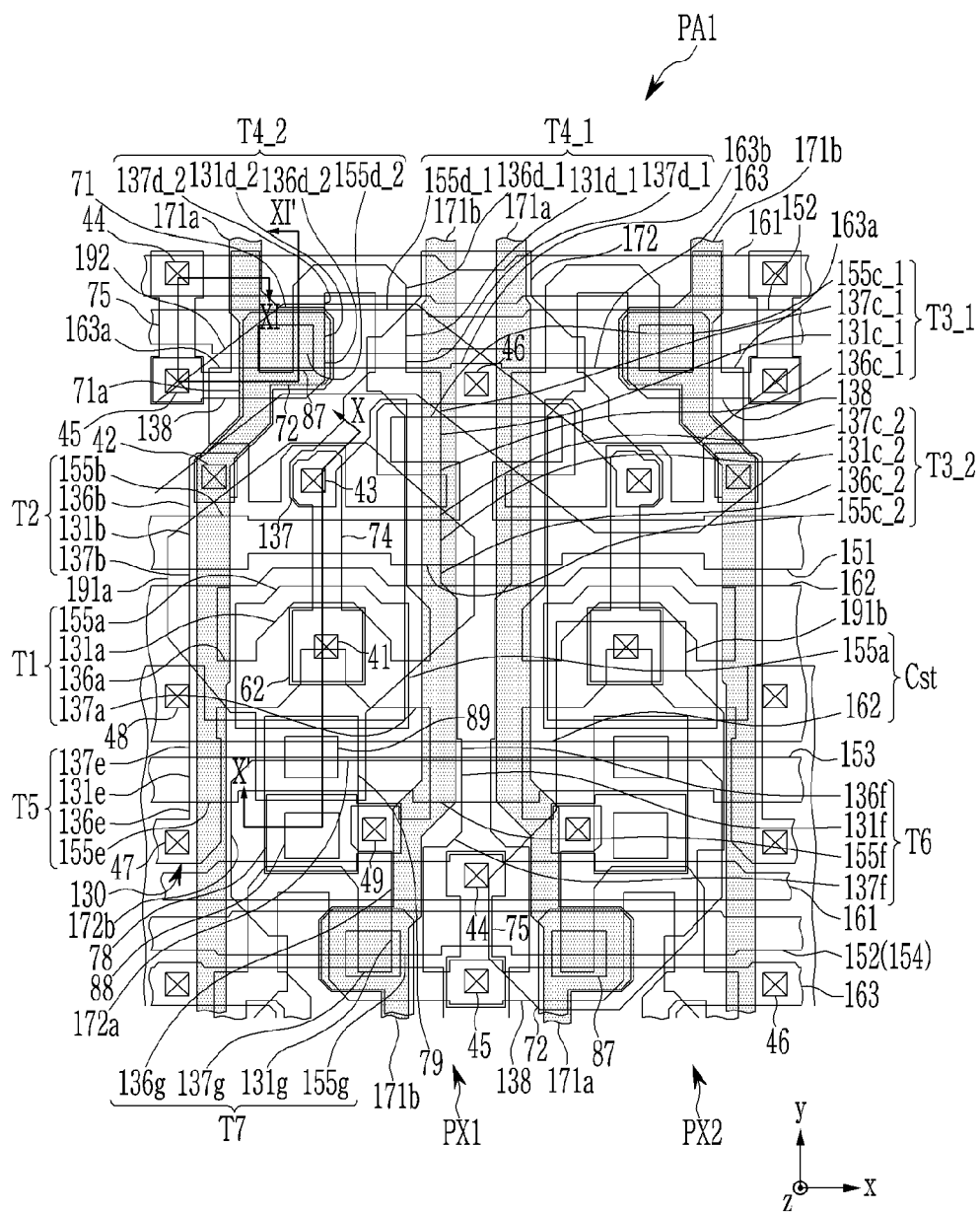
FIGS. 8 and 9 respectively illustrate a partial plan view of an exemplary embodiment of a first display area of a display device.
Figure 9:
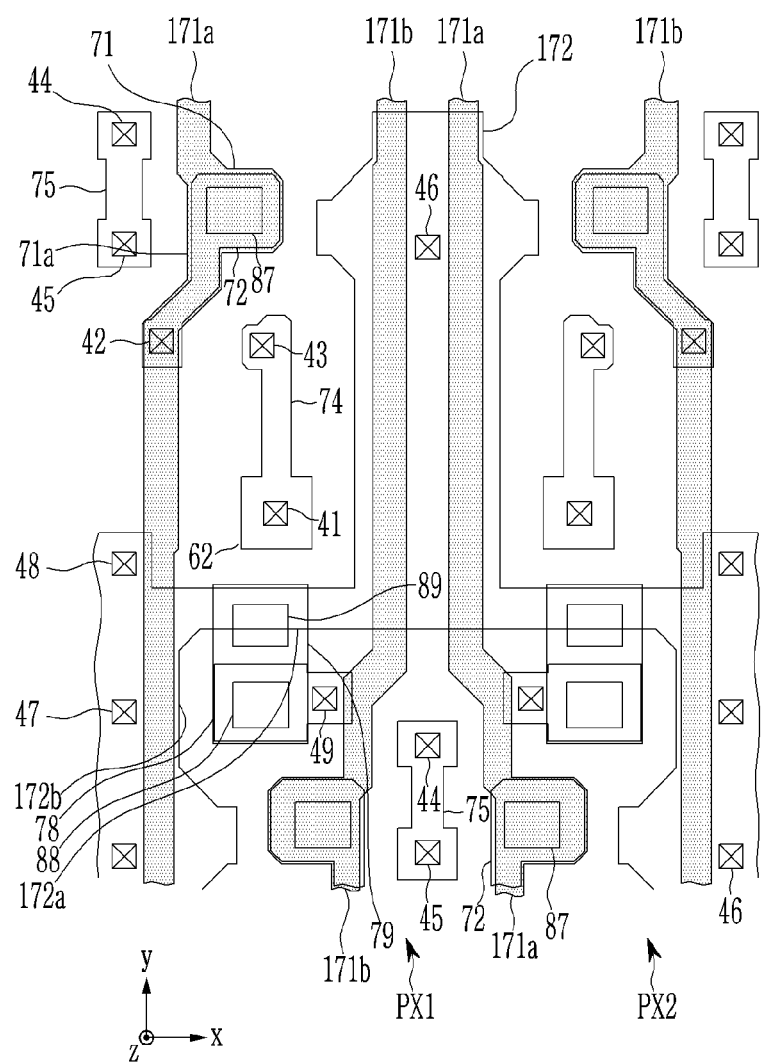
Figure 10:
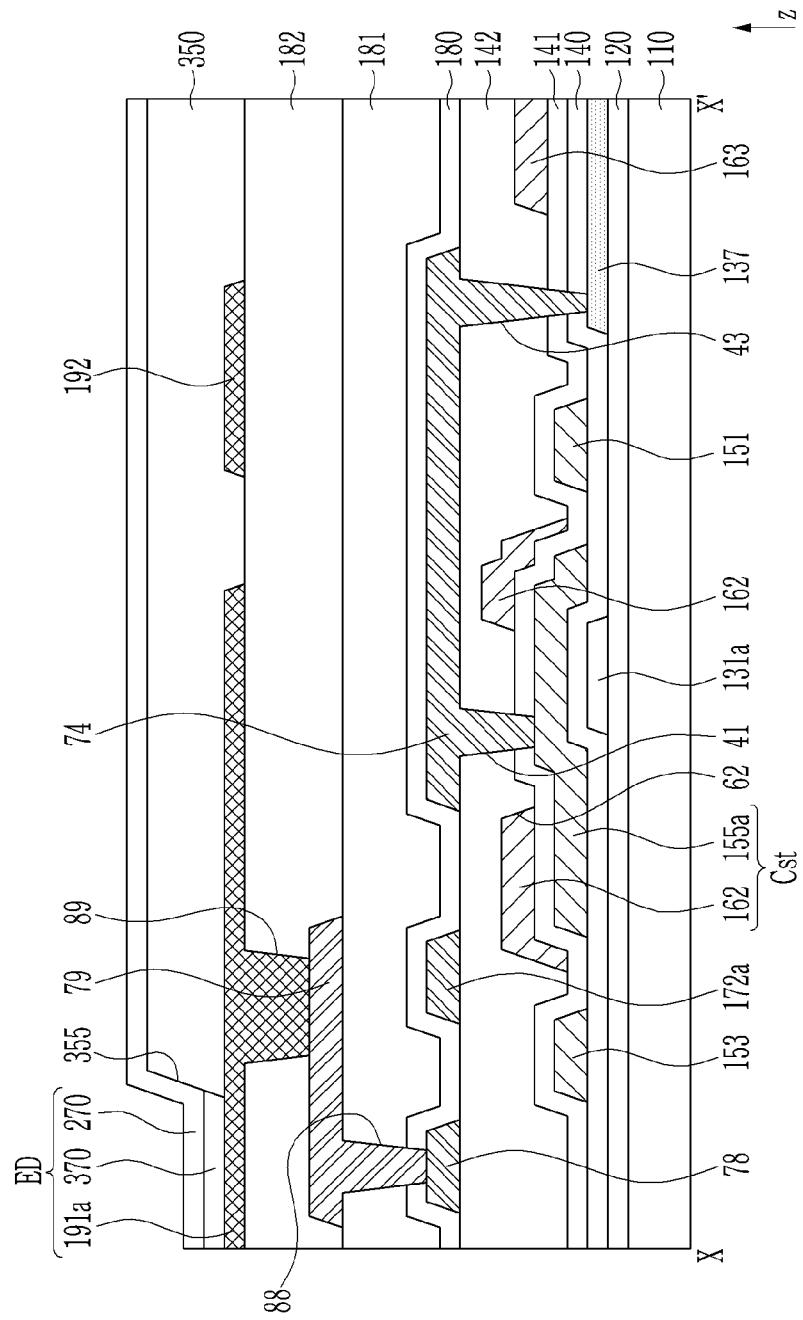
FIG. 10 illustrates a cross-sectional view taken along line X-X' of FIG. 8.
Figure 11:
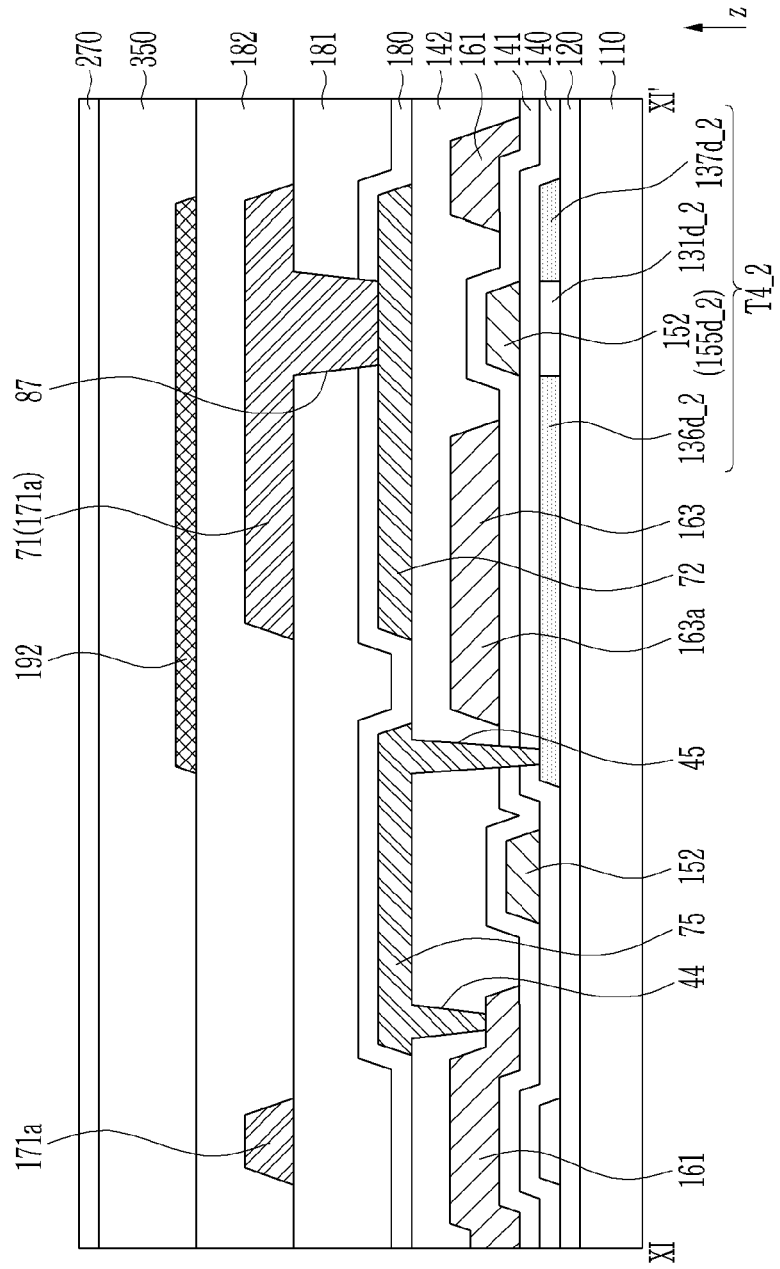
FIG. 11 illustrates a cross-sectional view taken along line XI-XI' of FIG. 8.
Figure 12:
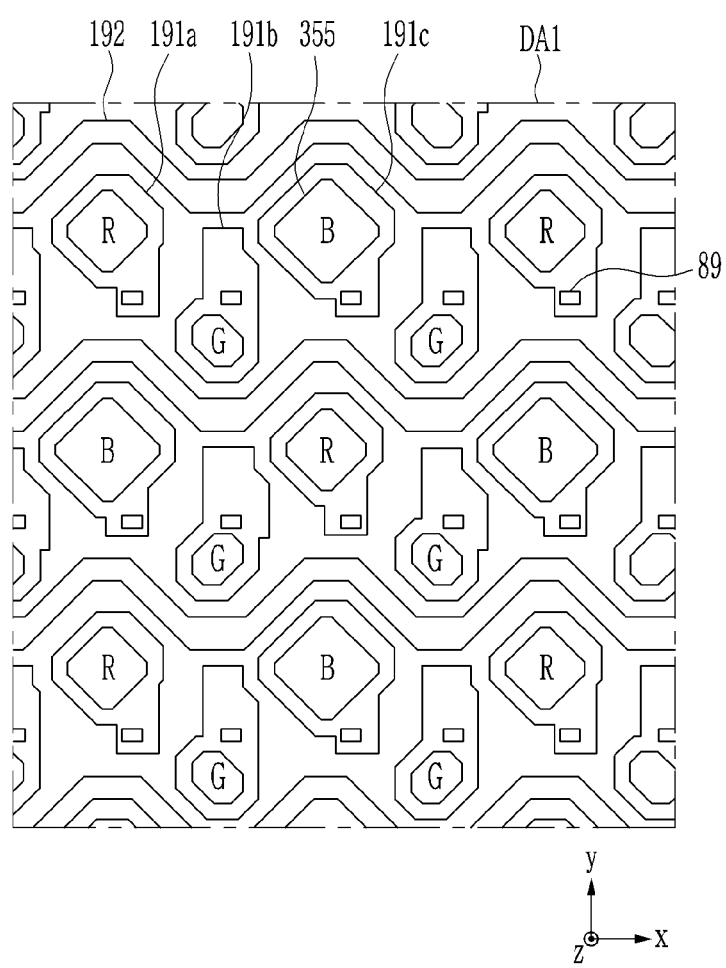
FIG. 12 illustrates a plan view of an exemplary embodiment of a pixel electrode layer of a display device.

FIGS. 8 and 9 respectively illustrate a partial plan view of an exemplary embodiment of a first display area DA1 of a display device, FIG. 10 illustrates a cross-sectional view taken along line X-X' of FIG. 8, FIG. 11 illustrates a cross-sectional view taken along line XI-XI' of FIG. 8, and FIG. 12 illustrates a plan view of an exemplary embodiment of a pixel electrode layer of a display device. FIG. 9 separately illustrates a portion (third conductive layer) of elements shown in FIG. 8.

The planar structure shown in FIG. 8 is a structure for two pixels PX1 and PX2 neighboring in the first direction x. One pixel PX1 or PX2 may include the transistors T1, T2, T3_1, T3_2, T4_1, T4_2, T5, T6, and T7 and the capacitor Cst that are connected to the scan lines 151 and 152, the emission control line 153, one of a pair of data lines 171a and 171b, and the driving voltage line 172. The structure shown in FIG. 8 may be repeatedly arranged in the first direction x and the second direction y. The structures of two neighboring pixels PX1 and PX2 may be symmetric in the first direction x. Two neighboring pixels in the second direction y may have left-right reversed shapes.

The display device includes a substrate 110 and various layers, wires, and elements disposed thereon. In an exemplary embodiment, the substrate 110 may include an insulating material such as a polymer such as a polyimide, glass, or the like.

A buffer layer 120, which is an insulating layer, may be disposed on the substrate 110, and an active pattern 130 may be disposed on the buffer layer 120. The active pattern 130 may be bent to have various shapes. The active pattern 130 disposed in one pixel PX1 or PX2 may form one continuum.

The active pattern 130 may include a plurality of channel regions having a semiconductor property and a plurality of conductive regions. The channel region includes channel regions 131a, 131b, 131c_1, 131c_2, 131d_1, 131d_2, 131e, 131f, and 131g forming respective channels of the transistors T1, T2, T3_1, T3_2, T4_1, T4_2, T5, T6, and T7. The conductive regions disposed at opposite sides of the respective channel regions 131a, 131b, 131c_1, 131c_2, 131d_1, 131d_2, 131e, 131f, and 131g may be source regions and drain regions of corresponding transistors T1, T2, T3_1, T3_2, T4_1, T4_2, T5, T6, and T7.

In an exemplary embodiment, the active pattern 130 may include a semiconductor material such as amorphous silicon, polycrystalline silicon, or an oxide semiconductor.

A first insulating layer 140 may be disposed on the active pattern 130. A first conductive layer including the scan lines 151 and 152, the emission control line 153, and a driving gate electrode 155a may be disposed on the first insulating layer 140.

The scan lines 151 and 152 and the emission control line 153 may substantially extend in the first direction x, respectively. The first scan line 151 may include a gate electrode 155c_1 protruding in the vicinity of a boundary between two adjacent pixels PX1 and PX2. The third scan line 154 shown in FIG. 7 may be a scan line of the same type as the second scan line 152, and may transmit a scan signal of a next stage after a scan signal transmitted by the second scan line 152.

The driving gate electrode 155a may be disposed in each of the pixels PX1 and PX2, and may be disposed between the first scan line 151 and the emission control line 153 in a plan view.

A second insulating layer 141 may be disposed on the first conductive layer. A second conductive layer including the initialization voltage line 161, a storage line 162, and a conductive pattern 163 may be disposed on the second insulating layer 141. The storage line 162 may be included in the above-described signal lines. The initialization voltage line 161 and the storage line 162 may substantially extend in the first direction x.

The initialization voltage line 161 may transmit the initialization voltage Vint. The storage line 162 may overlap most of the driving gate electrode 155a in each of the pixels PX1 and PX2, and an opening 62 may be defined in the storage line 162 to correspond to each of the pixels PX1 and PX2. Each opening 62 may overlap the driving gate electrode 155a. The conductive pattern 163 may be disposed between the initialization voltage line 161 and the storage line 162 in a plan view, and conductive patterns 163 respectively disposed in two adjacent pixels PX1 and PX2 may be connected to each other at a boundary of the two pixels PX1 and PX2 to form one continuum disposed to correspond to the two pixels PX1 and PX2. The storage line 162 and the conductive pattern 163 may transmit the driving voltage ELVDD.

Each channel of the transistors T1, T2, T3_1, T3_2, T4_1, T4_2, T5, T6, and T7 may be disposed inside one active pattern 130.

The first transistor T1 may include a channel region 131a of the active pattern 130, a source region 136a and a drain region 137a disposed at opposite sides of the channel region 131a, and a driving gate electrode 155a overlapping the channel region 131a in a plan view. The channel region 131a may be bent at least once. In an exemplary embodiment, the channel region 131a may have a meandering shape or a zigzag shape, and may have a vertically inverted U-shape as shown in FIG. 8, for example.

The second transistor T2 may include a channel region 131b, a source region 136b and a drain region 137b disposed at opposite sides of the channel region 131b, and a gate electrode 155b that is a portion of the scan line 151 overlapping the channel region 131b. The drain region 137b may be connected to the source region 136a of the first transistor T1.

The third transistor T3 may be provided in two portions to prevent a leakage current. That is, the third transistor T3 may include a third transistor first portion T3_1 and a third transistor second portion T3_2 that are connected to each other.

The third transistor first portion T3_1 may include a channel region 131c_1, a source region 136c_1 and a drain region 137c_1 disposed at opposite sides of the channel region 131c1, and a gate electrode 155c_1 which is a protruding portion of the scan line 151 overlapping the channel region 131c_1.

The third transistor second portion T3_2 may include a channel region 131c_2, a source region 136c_2 and a drain region 137c_2 disposed at opposite sides of the channel region 131c_2, and a gate electrode 155c_2 which is a portion of the scan line 151 overlapping the channel region 131c_2. The source region 136c_2 of the third transistor second portion T3_2 may be connected to the drain region 137a of the first transistor T1, and the drain region 137c_2 thereof may be connected to the source region 136c_1 of the third transistor first portion T3_1.

The fourth transistor T4 may also be provided in two portions to prevent a leakage current. That is, the fourth transistor T4 may include a fourth transistor first portion T4_1 and a fourth transistor second portion T4_2 that are connected to each other.

The fourth transistor first portion T4_1 may include a channel region 131d_1, a source region 136d_1 and a drain region 137d_1 disposed at opposite sides of the channel region 131d_1, and a gate electrode 155d_1 which is a portion of the scan line 152 overlapping the channel region 131d_1. The drain region 137d_1 may be connected to the drain region 137c_1 of the third transistor first portion T3_1. The conductive region of the active pattern 130 may further include an extension 137 extending from a point where the drain region 137d_1 and the drain region 137c_1 of the third transistor first portion T3_1 meet.

The fourth transistor second portion T4_2 may include a channel region 131d_2, a source region 136d_2 and a drain region 137d_2 disposed at opposite sides of the channel region 131d_2, and a gate electrode 155d_2 which is a portion of the scan line 152 overlapping the channel region 131d_2. The drain region 137d_2 may be connected to the source region 136d_1 of the fourth transistor first portion T4_1.

The fifth transistor T5 may include a channel region 131e, a source region 136e and a drain region 137e disposed at opposite sides of the channel region 131e, and a gate electrode 155e that is a portion of the emission control line 153 overlapping the channel region 131e. The drain region 137e may be connected to the source region 136a of the first transistor T1.

The sixth transistor T6 may include a channel region 131f, a source region 136f and a drain region 137f disposed at opposite sides of the channel region 131f, and a gate electrode 155f that is a portion of the emission control line 153 overlapping the channel region 131f. The source region 136f may be connected to the drain region 137a of the first transistor T1.

The seventh transistor T7 includes a channel region 131g, a source region 136g and a drain region 137g disposed at opposite sides of the channel region 131g, and a gate electrode 155g that is a portion of the scan line (the scan line 152 or 154 that is disposed at a lower portion in FIG. 8) overlapping the channel region 131g.

The conductive region of the active pattern 130 may further include an extension 138 extending from the source region 136d_2 of the fourth transistor second portion T4_2. The extension 138 may substantially extend in the first direction x.

The driving gate electrode 155a and the storage line 162 overlapping each other may form the capacitor Cst capable of maintaining the voltage of the driving gate electrode 155a. The second insulating layer 141 disposed between the driving gate electrode 155a and the storage line 162 may function as a dielectric of the capacitor Cst.

A third insulating layer 142 may be disposed on the second conductive layer.

Contact holes 42, 43, 45, 47, and 49 disposed on the conductive region of the active pattern 130 may be defined in the first insulating layer 140, the second insulating layer 141, and the third insulating layer 142. The second insulating layer 141 and the third insulating layer 142 may include a contact hole 41 disposed on the first conductive layer. The third insulating layer 142 may include contact holes 44, 46, and 48 disposed on the second conductive layer.

In an exemplary embodiment, the first insulating layer 140, the second insulating layer 141, and the third insulating layer 142 may include an inorganic insulating material such as a silicon nitride ($SiN_x$), a silicon oxide ($SiO_x$), and a silicon oxynitride (SiON), and/or an organic insulating material.

A third conductive layer including the driving voltage line 172 and connecting members 72, 74, 75, and 78 may be disposed on the third insulating layer 142.

The driving voltage line 172 may transmit the driving voltage ELVDD, and may receive the driving voltage ELVDD through a pad portion of the display device. The driving voltage line 172 may overlap a boundary between two adjacent pixels PX1 and PX2, and it may include a portion substantially extending in the second direction y, transverse portions 172a disposed in respective pixels PX1 and PX2 and substantially extending in the first direction x, and an extension 172b connected to ends of respective transverse portions 172a.

The driving voltage line 172 may be electrically connected to a portion 163b disposed at the boundary between the two adjacent pixels PX1 and PX2 of the conductive pattern 163 through the contact hole 46. The extension 172b of the driving voltage line 172 may be electrically connected to the source region 136e of the fifth transistor T5 through the contact hole 47, and may be electrically connected to the storage line 162 through the contact hole 48. Accordingly, the source region 136e of the fifth transistor T5 and the storage line 162 may be electrically connected to the driving voltage line 172 to receive the driving voltage ELVDD.

The connecting member 72 may be electrically connected to the source region 136b of the second transistor T2 through the contact hole 42. The connecting member 72 may include a portion extending in an oblique direction with respect to the first direction x and the second direction y.

The connecting member 74 may substantially extend in the second direction y to cross the scan line 151. One end of the connecting member 74 may be electrically connected to the driving gate electrode 155a through the contact hole 41. The contact hole 42 may be defined in the opening 62 of the storage line 162. The other end of the connecting member 74 may be electrically connected to the extension 137 of the active pattern 130 connected to the drain region 137d_1 of the fourth transistor first portion T4_1 and the drain region 137c_1 of the third transistor first portion T3_1 through the contact hole 43. Therefore, the drain region 137d_1 of the fourth transistor first portion T4_1 and the drain region 137c_1 of the third transistor first portion T3_1 may be electrically connected to the driving gate electrode 155a through the connecting member 74. The connecting member 74 may correspond to a driving gate node GN shown in FIG. 7 together with the driving gate electrode 155a.

The connecting member 75 may substantially extend in the second direction y. One end of the connecting member 75 may be electrically connected to the initialization voltage line 161 through the contact hole 44, and the other end thereof may be connected to the portion (referred to as the first conductive region) of the extension 138 of the active pattern 130 connected to the drain region 137g of the seventh transistor T7 through the contact hole 45. Accordingly, the drain region 137g of the seventh transistor T7 may be electrically connected to the initialization voltage line 161 to receive the initialization voltage Vint.

The connecting member 78 may be electrically connected to the drain region 137f of the sixth transistor T6 through the contact hole 49.

A fourth insulating layer 180 and a fifth insulating layer 181 may be disposed on the third conductive layer. A contact hole 87 defined on the connecting member 72 and a contact hole 88 defined on the connecting member 78 may be defined in the fourth insulating layer 180 and the fifth insulating layer 181.

In an exemplary embodiment, the fourth insulating layer 180 may include an inorganic insulating material and/or an organic insulating material, and the fifth insulating layer 181 may include an organic insulating material such as a polyimide, an acrylic polymer, and a siloxane polymer. In another exemplary embodiment, the fourth insulating layer 180 may be omitted.

A fourth conductive layer including the data lines 171a and 171b and a connecting member 79 may be disposed on the fifth insulating layer 181.

The data lines 171a and 171b correspond to the pair of data lines DLa and DLb described above, and they may substantially extend in the second direction y in a plan view and cross the scan lines 151 and 152 and the emission control line 153. The two data lines 171a and 171b may be correspondingly disposed in each of the pixels PX1 and PX2. In an exemplary embodiment, a pair of data lines 171a and 171b may be disposed to correspond to one pixel PX1, and a pair of data lines 171a and 171b may be disposed to correspond to one pixel PX2, for example. A shape of the first data line 171a at a left side and a shape of the second data line 171b at a right side may be symmetrical with respect to the boundary between the two adjacent pixels PX1 and PX2, and the shape of the first data line 171a and the shape of the second data line 171b may be symmetrical to each other.

The data lines 171a and 171b may include an extension 71 overlapping the connecting member 72. The extension 71 may be electrically connected to the connecting member 72 through a contact hole 87. Therefore, the source region 136b of the second transistor T2 may be electrically connected to the data lines 171a and 171b through the connecting member 72 to receive the data signal Dm.

The connecting member 79 may be electrically connected to the connecting member 78 of the third conductive layer through the contact hole 88. In a plan view, the connecting member 79 may be disposed between the pair of data lines 171a and 171b corresponding to the respective pixels PX1 and PX2.

In an exemplary embodiment, the first conductive layer, the second conductive layer, the third conductive layer, and the fourth conductive layer may include a conductive material such as copper (Cu), aluminum (Al), molybdenum (Mo), titanium (Ti), and tantalum (Ta), or a conductive material such as a metal alloy.

A sixth insulating layer 182 may be disposed on the fourth conductive layer. A contact hole 89 defined on the connecting member 79 may be defined in the sixth insulating layer 182. In an exemplary embodiment, the sixth insulating layer 182 may include an organic insulating material such as a polyacrylic-based resin, a polyimide-based resin, or the like.

A pixel electrode layer including pixel electrodes 191a and 191b and a voltage line 192 may be disposed on the sixth insulating layer 182. The pixel electrode layer may include a reflective or semi-transmittable conductive material.

Each of the pixel electrodes 191a and 191b may correspond to each of the pixels PX1 and PX2. Each of the pixel electrodes 191a and 191b is connected to the connecting member 79 and the connecting member 78 through the contact hole 89 to be electrically connected to the drain region 137f of the sixth transistor T6, thereby receiving a voltage.

The arrangement of pixel electrodes 191a, 191b, and 191c that may be arranged in the first display area DA1 is shown in FIG. 12. The pixel electrodes 191a, 191b, and 191c may be arranged in a Pentile matrix form. The pixel electrode 191a and the pixel electrode 191c may be alternately arranged in the first direction x. The pixel electrode 191a and the pixel electrode 191b may be alternately arranged in a diagonal direction inclined with respect to the first direction x and the second direction y. The pixel electrode 191c and the pixel electrode 191b may be arranged alternately in another diagonal direction. The pixel electrode 191a may be smaller than the pixel electrode 191c, and the pixel electrode 191b may be smaller than the pixel electrode 191a. The pixel electrode 191a may be a pixel electrode of the red pixel R, the pixel electrode 191b may be a pixel electrode of the green pixel G, and the pixel electrode 191c may be a pixel electrode of the blue pixel B. The arrangement and shape of the pixel electrodes 191a, 191b, and 191c may be variously changed.

Each of the voltage lines 192 may substantially extend in the first direction x and may be bent along edges of the pixel electrodes 191a, 191b, and 191c. The voltage lines 192 may cross the data lines 171a and 171b. The voltage lines 192 may be connected to a wire that may be disposed in the non-display area NA, and may transmit a constant voltage such as the initialization voltage Vint, the driving voltage ELVDD, and the common voltage ELVSS.

The voltage line 192 may overlap at least a portion of the channel region 131c_1 of the third transistor first portion T3_1 and at least a portion of the channel region 131d_1 of the fourth transistor first portion T4_1. Accordingly, external light is blocked from being incident on the channel region 131c_1 of the third transistor first portion T3_1 and the channel region 131d_1 of the fourth transistor first portion T4_1, which are directly connected to the driving gate electrode 155a, thereby preventing a leakage current from occurring. In addition, since a voltage variation at the driving gate electrode 155a due to the external light may be prevented, it is possible to prevent display defects such as a luminance change of an image and a color coordinate variation.

A seventh insulating layer 350 may be disposed on the pixel electrode layer. An opening 355 overlapping each of the pixel electrodes 191a, 191b, and 191c may be defined in the seventh insulating layer 350.

A light emitting layer 370 may be disposed on the pixel electrodes 191a, 191b, and 191c. The light emitting layer 370 may include an organic light emitting material or an inorganic light emitting material.

A common electrode 270 may be disposed on the light emitting layer 370. The common electrode 270 is also disposed on the seventh insulating layer 350, and may extend over the pixels PX1 and PX2. The common electrode 270 may transmit the common voltage ELVSS.

The pixel electrodes 191a, 191b, and 191c, the light emitting layer 370, and the common electrode 270 together form the light emitting diode ED. The pixel electrodes 191a, 191b, and 191c may be anodes of the light emitting diode ED, and the common electrode 270 may be a cathode of the light emitting diode ED.

An encapsulation layer for protecting the light emitting diode ED may be disposed on the common electrode 270, and the encapsulation layer may include at least one inorganic layer and may further include at least one organic layer.

The relationship between the connecting member 75 for transmitting the initialization voltage Vint and the data lines 171a and 171b will be described below. The data lines 171a and 171b may include a bent portion 71a bent in the direction away from the connecting member 75 in the vicinity of the connecting member 75. By disposing the data lines 171a and 171b in the fourth conductive layer which is different from the third conductive layer in which the connecting member 75 is disposed, the data lines 171a and 171b may be further separated from the connecting member 75. Accordingly, a parasitic capacitance between the connecting member 75 and the data lines 171a and 171b may be reduced, and coupling between the initialization voltage Vint and the data signal Dm may be prevented, thereby preventing defective display such as horizontal line spot.

The conductive pattern 163 may include a shielding portion 163a disposed between the connecting member 75 and the data lines 171a and 171b. The shielding portion 163a may overlap a portion (referred to as the second conductive region) disposed between the data lines 171a and 171b and the connecting member 75 of the extension 138 of the active pattern 130 which is electrically connected to the connecting member 75 and transmits the initialization voltage Vint, and thus may shield between the data lines 171a and 171b and the extension 138 of the active pattern 130. Therefore, the coupling between the data signal Dm and the initialization voltage Vint, which the data lines 171a and 171b transmit, may be further prevented.

A constant voltage other than the initialization voltage Vint, for example, the driving voltage ELVDD or the common voltage ELVSS, is applied to the voltage line 192 disposed in the pixel electrode layer, so that the coupling between the data signal Dm and the initialization voltage Vint may be further reduced by overlapping of the voltage line 192 (which crosses the data lines 171a and 171b) and the data lines 171a and 171b.

Now, a specific structure of the second display area DA2 of the display device will be described with a focus on differences from the exemplary embodiment described above with reference to FIGS. 13 and 14.

Figure 13:
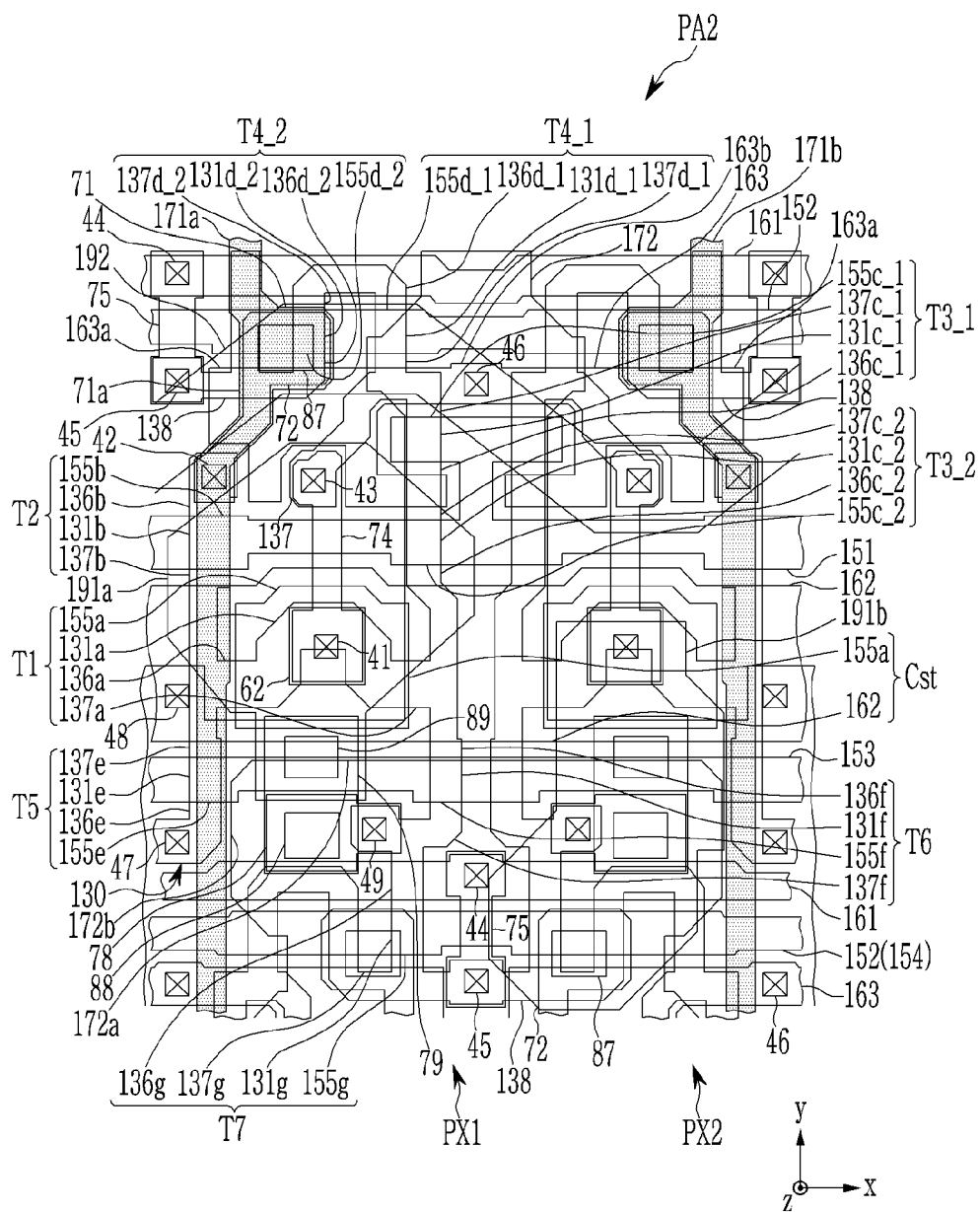
FIGS. 13 and 14 respectively illustrate a partial plan view of an exemplary embodiment of a second display area of a display device.
Figure 14:
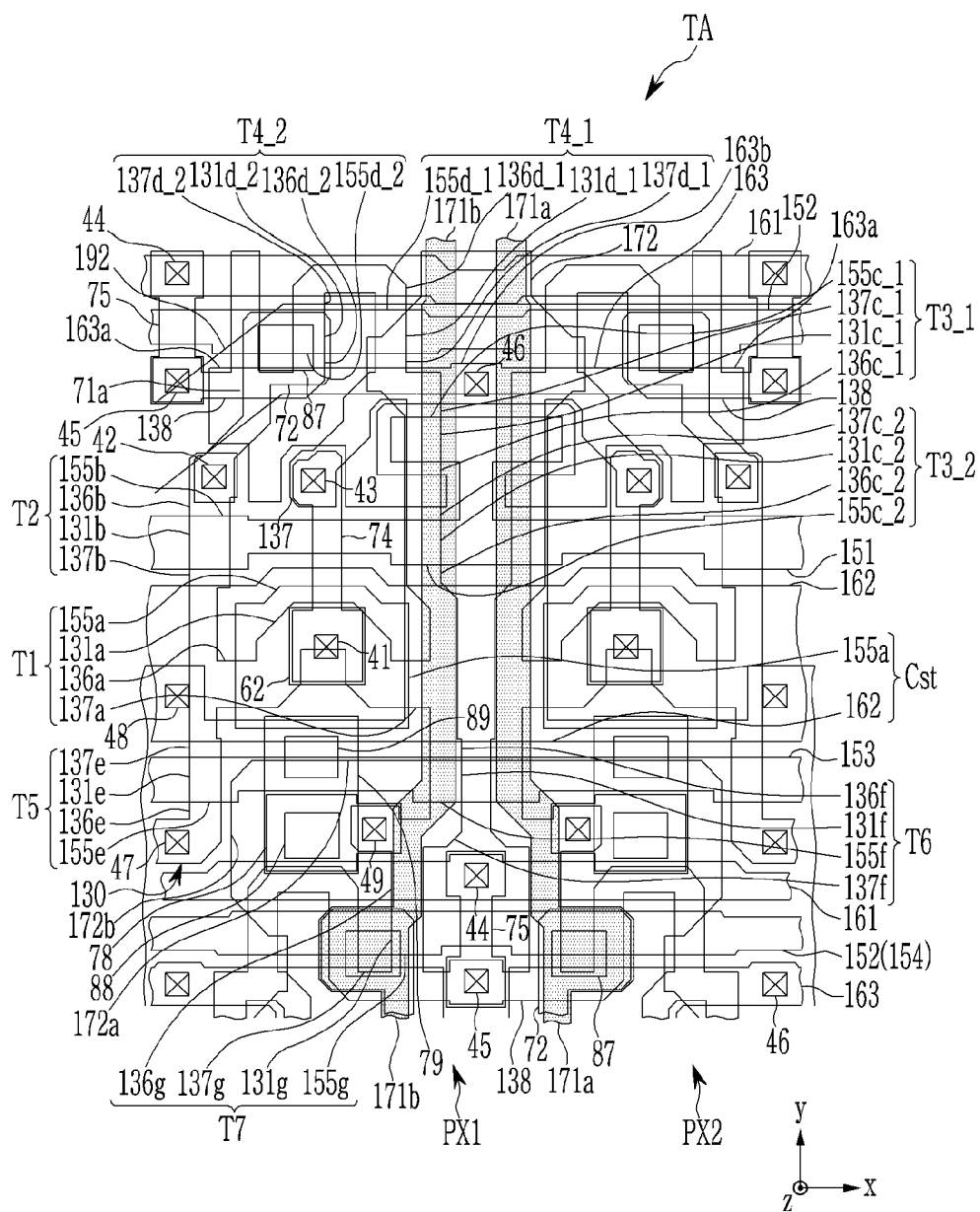

FIGS. 13 and 14 respectively illustrate a partial plan view of an exemplary embodiment of a second display area DA2 of a display device. FIG. 13 illustrates a planar structure of the second pixel area PA2, and FIG. 14 illustrates a planar structure of the transmission area TA.

FIG. 13 illustrates two adjacent pixels PX1 and PX2 disposed in the second pixel area PA2 of the second display area DA2, which are substantially the same as the pixel structure shown in FIG. 8. However, only one data line 171a or 171b is correspondingly disposed in each pixel PX1 or PX2. That is, only the first data line 171a of the pair of data lines 171a and 171b is disposed in the pixel PX1, and only the second data line 171b of the pair of data lines 171a and 171b is disposed in the pixel PX2. The pixel PX1 may receive the data signal Dm from the first data line 171a, and the pixel PX2 may receive the data signal Dm from the second data line 171b.

The pixels PX1 and PX2 shown in FIG. 13 are, for example, pixels of the pixel columns $C_i$ and $C_{i+1}$ as shown in FIG. 5. In an alternative exemplary embodiment, when the pixels PX1 and PX2 are pixels of the pixel columns (e.g., $C_{i+1}$ and $C_{i+2}$ in FIG. 5) that receive the data signal Dm from the second data line 171b of the pair of data lines 171a and 171b, only the second data line 171b may be disposed in the pixels PX1 and PX2. When the pixel PX1 is a pixel of a pixel column (e.g., $C_{i+2}$ in FIG. 5) that receives the data signal from the second data line 171b and the pixel PX2 is a pixel of a pixel column (e.g., $C_{i+3}$ in FIG. 5) that receives the data signal Dm from the first data line 171a, only the second data line 171b is disposed in the pixel PX1 and only the first data line 171a is disposed in the pixel PX2.

FIG. 14 illustrates an area corresponding to approximately two pixels in the transmission area TA of the second display area DA2. A structure of the transmission area TA is substantially the same as that shown in FIG. 8, but only one of of the pair of data lines 171a and 171b is correspondingly disposed at each of adjacent pixel columns (for example, $C_{i+2}$ and $C_{i+3}$ in FIG. 5). In addition, the pixel electrodes 191a, 191b, and 191c shown in FIGS. 8 and 12 may not be disposed in the transmission area TA. As such, by excluding the conductive layers that may lower the transmittance of the transmission area TA from the transmission area TA, the transmittance of the transmission area TA may be improved.

In order to further improve the transmittance of the transmission area TA, it may be advantageous to eliminate both of the pair of data lines 171a and 171b, but in this case, the data signal Dm cannot be transmitted to a pixel disposed above the transmission area TA. When the pixel is not disposed above the transmission area TA, both data lines 171a and 171b may not be disposed.

Unlike the shown structure, when two adjacent pixels disposed below or above the transmission area TA are pixels of two pixel columns (for example, $C_i$ and $C_{i+1}$ in FIG. 5) that sequentially receive the data signal Dm from the first data line 171a and the second data line 171b from the left, only the first data line 171a or the second data line 171b may be disposed in the transmission areas TA of the corresponding pixel columns. When two adjacent pixels disposed below or above the transmission area TA are pixels of two pixel columns (for example, $C_{i+1}$ and $C_{i+2}$ in FIG. 5) that receive the data signal Dm from the second data line 171b, only the second data line 171b may be disposed in the transmission areas TA of the corresponding pixel columns.

In the pixel electrode layer, the pixel electrodes 191a, 191b, and 191c may be removed from the transmission area TA, as described above. However, the voltage line 192 is desired to be substantially and continuously provided in the first direction x across the second pixel area PA2 adjacent to the left and right of the transmission area TA so that the voltage transmitted through the voltage line 192 may be applied to the pixels of the pixel column. Thus, the voltage line 192 may also be provided in the transmission area TA. In this case, when the voltage line 192 is not provided in the zigzag shape as shown in FIG. 8 but most of the voltage line 192 is provided to overlap the second scan line 152 as shown in FIG. 14, a decrease in transmittance due to the voltage line 192 may be minimized. In the area where the second scan line 152 is disposed, since light is previously blocked by the second scan line 152, it is advantageous to improve the transmittance of the transmission area TA by forming the voltage line 192 to overlap the conductive layer. In the transmission area TA, the voltage line 192 may be provided to overlap another signal line substantially extending in the first direction x, for example, the first scan line 151, in addition to the second scan line 152.

Finally, an exemplary embodiment of a display device and a driving method thereof will be described with reference to FIGS. 15 and 16 together with the above-described drawings.

Figure 15:
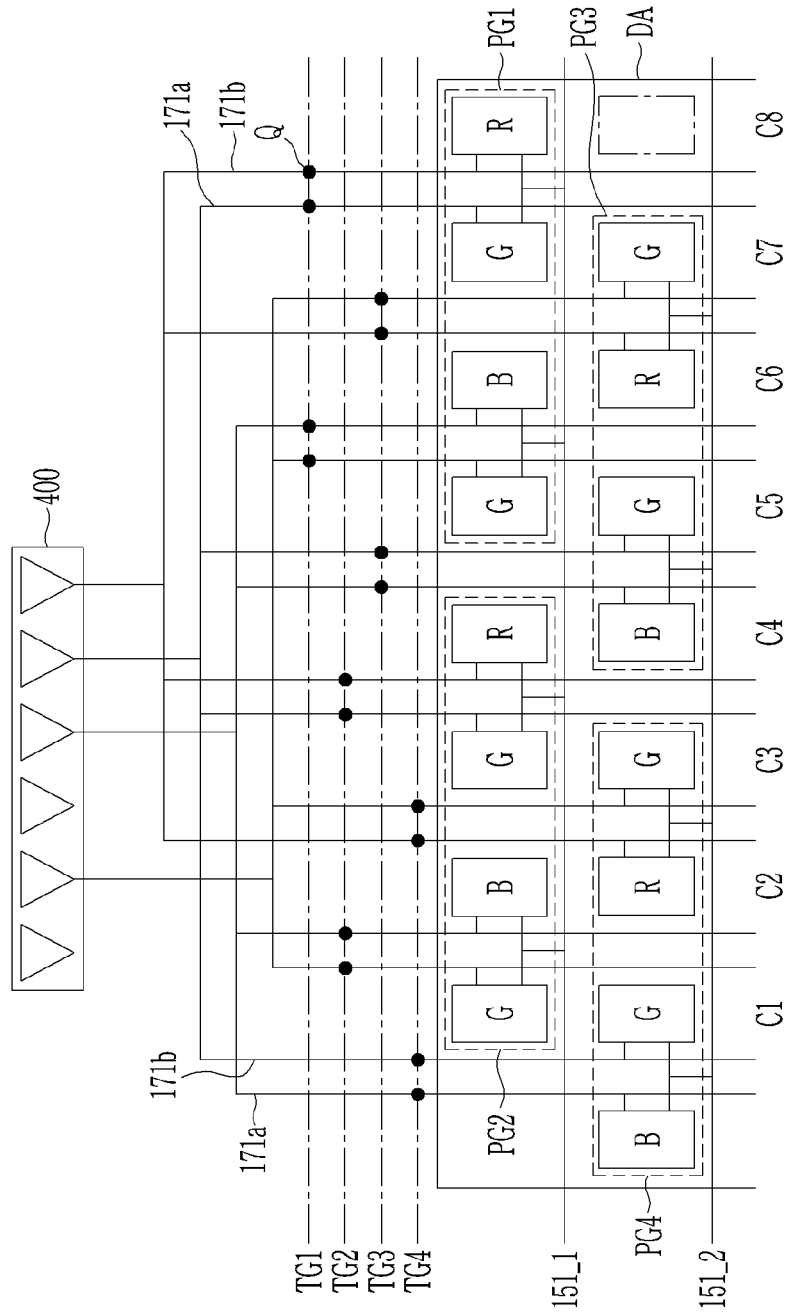
FIG. 15 illustrates a circuit diagram of an exemplary embodiment of a circuit connected to a data line of a display device.
Figure 16:
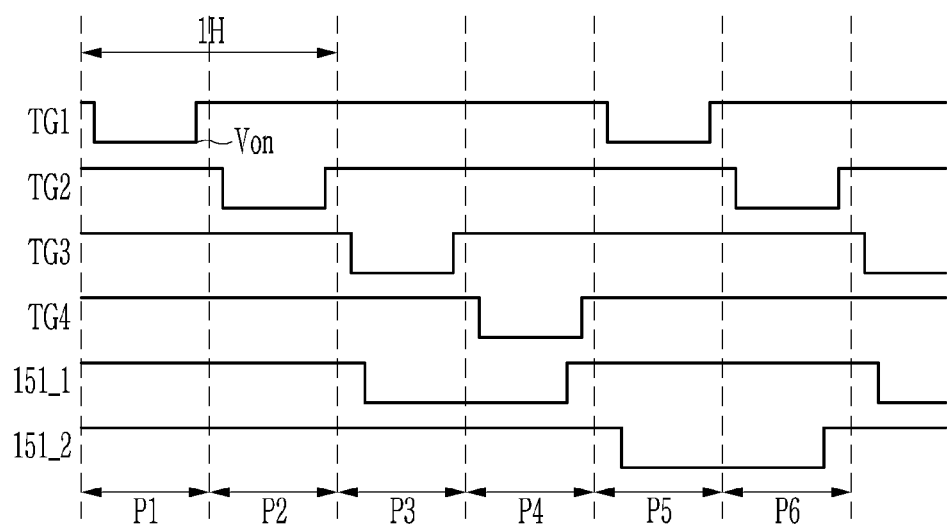
FIG. 16 illustrates a waveform diagram of an exemplary embodiment of a driving signal of a display device.

FIG. 15 illustrates an exemplary embodiment of a circuit diagram of a circuit connected to a data line of a display device, and FIG. 16 illustrates a waveform diagram of an exemplary embodiment of a driving signal of a display device.

Referring to FIG. 15, the display device in the exemplary embodiment includes a data driver 400 for applying the data signal Dm. The data driver 400 may be connected to the data lines 171a and 171b, and may output the data signal Dm to the data lines 171a and 171b.

The display area DA may include the pixels R, G, and B, the data lines 171a and 171b, and scan lines 151_1 and 151_2. Each of the scan lines 151_1 and 151_2 may correspond to the scan line 151 described above.

The pixels R, G, and B may be connected to the corresponding data lines 171a and 171b and the corresponding scan lines 151_1 and 151_2, respectively. A transistor connected to the data line 171a or 171b and the scan line 151_1 or 151_2 in each of the pixels R, G, and B may be the second transistor T2 described above.

When the pixels R, G, and B are substantially arranged in a matrix form, the pair of data lines 171a and 171b may be disposed in each of the pixel columns C1, C2, C3, ..., C8 to be connected to the pixels R, G, and B of the corresponding pixel columns C1, C2, C3, ..., C8. The pixels R, G, and B of each of the pixel columns C1, C2, C3, ..., C8 may be alternately connected to the pair of data lines 171a and 171b.

A demultiplexer circuit including transmission gate lines TG1, TG2, TG3, and TG4 and switching elements Q may be disposed between the data driver 400 and the display area DA. The transmission gate lines TG1, TG2, TG3, and TG4 may transmit a transmission gate signal, and may cross the data lines 171a and 171b. Each of the data lines 171a and 171b is connected to a switching element Q connected to at least one of the transmission gate lines TG1, TG2, TG3 and TG4, and then, when a gate-on voltage is applied to the transmission gate lines TG1, TG2, TG3, and TG4, the data signal Dm from the data driver 400 may be applied to the corresponding data lines 171a and 171b.

Referring to FIGS. 15 and 16, when a gate-on voltage Von (here, a low level) is applied to the transmission gate line TG1 during about half (H/2) of a horizontal period in a first period P1, the data lines 171a and 171b connected to the switching element Q connected to the transmission gate line TG1 are charged with a voltage of the data signal Dm.

Then, when the gate-on voltage Von is applied to the transmission gate line TG2 during about half (H/2) of the horizontal period in a second period P2, the data lines 171a and 171b connected to the switching element Q connected to the transmission gate line TG2 are charged with the voltage of the data signal Dm. Similarly, the gate-on voltage Von may be sequentially applied to the transmission gate line TG3 and the transmission gate line TG4 in a third period P3 and a fourth period P4, respectively.

Then, when the gate-on voltage Von is applied to the scan line 151_1 during about one horizontal period 1H in the third period P3 and the fourth period P4, the voltages charged in the corresponding data lines 171a and 171b are applied to the pixels R, G, and B of pixel groups PG1 and PG2 connected to the data lines 171a and 171b connected through the transmission gate lines TG1 and TG2 and the switching elements Q while being connected to the scan line 151_1.

Then, when the gate-on voltage Von is applied to the scan line 151_2 during about one horizontal period 1H in a fifth period P5 and a sixth period P6, the voltages charged in the corresponding data lines 171a and 171b are applied to the pixels R, G, and B of pixel groups PG3 and PG4 connected to the data lines 171a and 171b connected through the transmission gate lines TG3 and TG4 and the switching elements Q while being connected to the scan line 151_2.

According to the above-described driving method, since there is a period in which the data voltage is first charged in one of the data lines 171a and 171b and the data voltage is charged in the other of data lines 171a and 171b in a state of being floated from the data driver 400, a ripple of the initialization voltage Vint coupled with the data signal Dm of the data lines 171a and 171b affects data voltages of the other of the data lines 171a and 171b in a floating state, which may result in display defects such as horizontal line spots. However, the display device in the exemplary embodiments may prevent the coupling between the initialization voltage Vint and the data signal Dm to prevent the display defects as described above.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a first display area including a plurality of first pixel areas;
a second display area including a plurality of second pixel areas and a plurality of transmission areas;
a plurality of pixels arranged in a matrix form in the first and second display areas; and
a first signal line and a second signal line disposed to correspond to each pixel column of a plurality of pixel columns in the plurality of pixels,
wherein in each of the pixel columns, a number of pixels overlapping one of the first and second signal lines is greater than a number of pixels overlapping a remaining one of the first and second signal lines,
wherein two pairs of the first and second signal lines correspond to each pair of contiguous pixel columns in the first display area, and
wherein in each of the pixel columns, both the first and second signal lines overlap each pixel in the first display area and only one of the first and second signal lines overlaps each pixel in the second display area.

2. The display device of claim 1, wherein
the first and second signal lines are disposed in the first display area in each of the pixel columns.

3. The display device of claim 1, wherein
the plurality of second pixel areas and the plurality of transmission areas are arranged in a checkerboard pattern in the second display area.

4. The display device of claim 1, wherein
the first and second signal lines are data lines transmitting a data signal.

5. The display device of claim 1, wherein
each of the plurality of second pixel areas includes at least one pixel electrode, and the plurality of transmission areas do not include a pixel electrode.

6. The display device of claim 5, wherein
the second display area includes a plurality of scan lines and a voltage line disposed in a same layer as the at least one pixel electrode, and
the voltage line includes a portion which overlaps at least one of the plurality of scan lines and extends side by side therewith in at least one of the plurality of transmission areas.

7. The display device of claim 1, wherein
pixels of each of the pixel columns among the plurality of pixels are alternately connected to the first and second signal lines one by one.

8. The display device of claim 1, wherein
sizes of the plurality of second pixel areas and sizes of the plurality of transmission areas are the same.

9. The display device of claim 1, wherein
a size of at least one of the plurality of transmission areas is larger than that of each of the plurality of second pixel areas.

10. The display device of claim 1, wherein each of the plurality of second pixel areas includes at least one of a red pixel, a green pixel, and a blue pixel.

11. The display device of claim 10, wherein each of the plurality of second pixel areas includes one red pixel, one blue pixel, and two green pixels.

12. The display device of claim 10, wherein the second display area displays a single color.

13. The display device of claim 1, further comprising an optical member overlapping the second display area.

14. A display device comprising:
a first display area including a plurality of first pixel areas;
a second display area including a plurality of second pixel areas and a plurality of transmission areas;
a plurality of pixels arranged in a matrix form in the first and second display areas;
a plurality of scan lines extending in a first direction in the first and second display areas;
a first signal line and a second signal line extending in a second direction crossing the first direction in the plurality of pixels and overlapping each pixel column of a plurality of pixel columns; and
an optical member overlapping the second display area,
wherein in each of the pixel columns, a number of pixels overlapping one of the first and second signal lines is greater than a number of pixels overlapping a remaining one of the first and second signal lines,
wherein two pairs of the first and second signal lines correspond to each pair of contiguous pixel columns in the first display area, and
wherein in each of the pixel columns, both the first and second signal lines overlap each pixel in the first display area and only one of the first and second signal lines overlaps each pixel in the second display area.

15. The display device of claim 14, wherein the plurality of second pixel areas and the plurality of transmission areas are alternately disposed in the first direction and the second direction one by one.

16. The display device of claim 15, wherein each of the plurality of second pixel areas includes at least one pixel electrode, and the plurality of transmission areas do not include a pixel electrode.

17. The display device of claim 16, wherein the second display area includes a plurality of scan lines and a voltage line disposed in the same layer as the at least one pixel electrode, and
the voltage line of the transmission area includes a portion which overlaps at least one of the plurality of scan lines and extends side by side therewith.

18. The display device of claim 15, wherein the first and second signal lines are data lines which transmit a data signal, and
pixels of each of the pixel columns among the plurality of pixels are alternately connected to the first and second signal lines one by one.

19. The display device of claim 15, wherein sizes of the plurality of second pixel areas and sizes of the plurality of transmission areas are the same.

20. The display device of claim 15, wherein a size of at least one of the plurality of transmission areas is larger than that of each of the plurality of second pixel areas.

* * * * *